(12) United States Patent
Patel et al.

(10) Patent No.: US 12,191,854 B2
(45) Date of Patent: Jan. 7, 2025

(54) PPA IMPROVEMENT FOR VOLTAGE MODE DRIVER AND ON-DIE TERMINATION (ODT)

(71) Applicant: SanDisk Technologies LLC, Addison, TX (US)

(72) Inventors: Nirav Natwarbhai Patel, Bangalore (IN); Shiv Harit Mathur, Bangalore (IN); Sai Ravi Teja Konakalla, Bangalore (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 70 days.

(21) Appl. No.: 17/949,990

(22) Filed: Sep. 21, 2022

(65) Prior Publication Data

US 2024/0097681 A1  Mar. 21, 2024

(51) Int. Cl.
*H03K 19/00* (2006.01)
*G11C 7/10* (2006.01)
*G11C 16/04* (2006.01)

(52) U.S. Cl.
CPC ....... *H03K 19/0005* (2013.01); *G11C 7/1048* (2013.01); *G11C 16/0483* (2013.01)

(58) Field of Classification Search
CPC .... H03K 5/1252; H03K 17/16; H03K 19/003; H03K 19/0005; H03K 19/017545; H03K 19/01825; H03K 19/018557; G06F 13/4086; H05K 1/0246
See application file for complete search history.

(56) References Cited

U.S. PATENT DOCUMENTS

2022/0052689 A1\* 2/2022 Yagi ..................... G11C 7/1057

\* cited by examiner

*Primary Examiner* — Jung Kim
(74) *Attorney, Agent, or Firm* — Sheppard, Mullin, Richter & Hampton LLP

(57) ABSTRACT

Systems and methods for improving the power, performance, and area (PPA) for a voltage mode driver and on die termination (ODT). A voltage mode driver having first and second circuits in a pulldown design. The first circuit has a plurality of nMOS devices in parallel, the plurality of nMOS devices being common to a first resistor. The second circuit is in parallel with the first circuit and has an nMOS device in series with a second resistor. The second circuit is configured to be enabled when the pulldown impedance of the first circuit, with the second circuit disabled and all of the nMOS devices of the first circuit turned on, is greater than a desired pulldown impedance. The voltage mode driver may also be a pullup design, or have both pulldown and pullup stages.

15 Claims, 29 Drawing Sheets

Table 1

VCCQ=1.2V, R_PU=R_PD=100Ω at VCCQ/2, R_ODT (ideal) = 50Ω, I_VCCQ=DC current drawn from supply

| Sr no | R_PU (normalized) | | | R_PD (normalized) | | | R_ODT (Ω) | | | % increase in R_ODT | I_VCCQ (mA) | I_VCCQ per 50Ω ODT (mA) |
| --- | --- | --- | --- | --- | --- | --- | --- | --- | --- | --- | --- | --- |
| | at 20% of VCCQ | at 50% of VCCQ | at 80% of VCCQ | at 20% of VCCQ | at 50% of VCCQ | at 80% of VCCQ | at VIL(AC)=VCCQ/2-100mV | at VCCQ/2 | at VIH(AC)=VCCQ/2+100mV | at VCCQ/2 | at VCCQ/2 | at VCCQ/2 |
| 1 | 1.00 | 1 | 1.00 | 1.00 | 1 | 1.00 | 50.00 | 50.00 | 50.00 | 0.00 | 6 | 6.00 |
| 2 | 1.07 | 1 | 0.95 | 1.00 | 1 | 1.00 | 53.95 | 52.75 | 51.65 | 5.50 | 6 | 6.33 |
| 3 | 1.00 | 1 | 1.00 | 0.85 | 1 | 1.00 | 55.73 | 59.22 | 62.89 | 18.44 | 6 | 7.11 |
| 4 | 1.00 | 1 | 1.00 | 0.85 | 1 | 0.85 | 56.98 | 65.21 | 76.67 | 30.41 | 6 | 7.82 |
| 5 | 1.16 | 1 | 0.95 | 1.00 | 1 | 1.00 | 57.45 | 54.25 | 51.93 | 8.49 | 6 | 6.51 |
| 6 | 1.00 | 1 | 1.00 | 0.85 | 1 | 0.85 | 56.36 | 61.72 | 68.06 | 23.44 | 6 | 7.41 |
| 7 | 1.31 | 1 | 0.85 | 1.00 | 1 | 1.00 | 68.14 | 61.79 | 56.42 | 23.58 | 6 | 7.41 |
| 8 | 1.22 | 1 | 0.85 | 0.85 | 1 | 0.85 | 72.29 | 72.68 | 72.30 | 45.35 | 6 | 8.72 |
| 9 | 1.22 | 1 | 0.85 | 1.31 | 1 | 0.85 | 73.36 | 76.48 | 79.23 | 52.96 | 6 | 9.18 |
| 10 | 1.47 | 1 | 0.85 | 1.31 | 1 | 0.85 | 92.96 | 86.88 | 81.84 | 73.76 | 6 | 10.43 |
| 11 | 1.47 | 1 | 0.85 | 1.47 | 1 | 0.85 | 94.63 | 93.95 | 94.62 | 87.90 | 6 | 11.27 |

FIG. 8

Table 2

| VOUT (% of VDDQ) | RPD (unit ZQ=240Ω) | | linearity (PD) | |
|---|---|---|---|---|
| | MAX | MIN | MAX | MIN |
| 50 | 1.1 | 0.8 | 1.1 | 0.8 |
| 80 | 1 | 1 | NA | NA |
| 110 | 1.25 | 0.9 | 1.25 | 0.9 |

FIG. 11

Table 3

| VOUT (% of VDDQ) | RPD (unit ZQ=240Ω) | | linearity (PD) | |
|---|---|---|---|---|
| | MAX | MIN | MAX | MIN |
| 50 | 1.1 | 0.8 | 1.058 | 0.83 |
| 80 | 1.04 | 0.96 | NA | NA |
| 110 | 1.25 | 0.9 | 1.2 | 0.94 |

FIG. 12

Proposed vs conventional design results comparison

| Design | Total multiplier of NMOS for 240Ω segment (W=270n, L=90n) | lenth of R_poly1 for 240Ω segment (W=11.84u) | lenth of R_poly2 for 240Ω segment (W=2.96u) | Pull-down Linearity (% of R) | | Pull-down Step size (% of R) | PADCAP (fF) (Pull-down only) (34Ω, 7 segments) | |
|---|---|---|---|---|---|---|---|---|
| | | | | MIN | MAX | MAX | MIN | MAX |
| old_1x | 141 | 2.4u | NA | 0.8 | 1.25 | 3.09 | 214.9 | 233.1 |
| old_2x | 258 | 3u | NA | 0.86 | 1.22 | 5.25 | 321.3 | 334.6 |
| old_4x | 468 | 3.2u | NA | 0.88 | 1.2 | 9.83 | 541.8 | 557.9 |
| old_6x | 702 | 3.3u | NA | 0.91 | 1.17 | 11.38 | 794.5 | 814.8 |
| Proposed | 175 | 3.5u | 3.5u | 0.9 | 1.19 | 2.07 | 285.6 | 310.8 |

FIG. 15

PPA IMPROVEMENT FOR VOLTAGE MODE DRIVER AND ON-DIE TERMINATION (ODT)

DESCRIPTION OF RELATED ART

Most semiconductor devices include an input circuit configured to receive signals from the outside world via input pads (or pins) and an output circuit configured to provide internal signals to the outside via output pads (or pins). The input circuit has a termination resistor for impedance matching of the external transmission line. The output circuit has an output driver, which has a resistance. The impedance of both the termination resistor and the output driver can change due to various circumstances such as variation of a power supply voltage, a change in operating temperature, etc. Thus, an impedance mismatch can arise.

The impedance mismatch can cause signal reflection, which can compromise signal integrity. As the operating speed of electrical products has increased, the swing width (that is the difference between high and low logic levels) of a signal interfaced between semiconductor devices gradually has been reduced in order to reduce supply current and to minimize the delay time taken for signal transmission. However, the reduction in the swing width of the signal easily exposes the signal to external noise, causing signal reflection to become more critical at an interface terminal due to impedance mismatch. Thus, the impedance mismatch may lead to difficulty in high-speed transmission of data and distortion of output data.

Weak output drivers may result in bad slopes on I/O signals. Strong output drivers may consume high currents and result in too much simultaneous switching noise (SSN) on power lines and I/O pins. Mismatch in pull up and pull down impedances also degrades signal integrity. Therefore, at high speeds, any deviation in output driver impedance from target impedance results in shrinking of eye aperture and may result in data transmission errors or losses.

To alleviate impedance mismatch, the device's output drivers and/or the device's termination resistors may be periodically calibrated. One calibration technique is referred to as a ZQ calibration. Conventionally, ZQ calibration may use a precision calibration resistor that is located off chip. The chip may have a variable impedance circuit which is calibrated with respect to the off chip resistor. The ZQ calibration adjusts the impedance of the variable impedance circuit until it is calibrated to the off chip resistor. This results in an impedance code that can be used to adjust the impedance of the device's output drivers or on-die termination circuitry.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 8 is a table showing an example simulation of how ODT changes with non-linear R_PU and R_PD without considering calibration error.

FIG. 11 shows an example of a linearity specification for DDR4 driver pull-down (PD).

FIG. 12 shows an example of a linearity specification taking into account 4% calibration error.

FIG. 15 shows an example design-results comparison of the linearity, step size, and pad-cap at the schematic level between a conventional driver design as shown in FIG. 9 and a design for DDR4 pull-down according to an example embodiment of the disclosed technology.

The figures are not exhaustive and do not limit the present disclosure to the precise form disclosed.

DETAILED DESCRIPTION

Embodiments of the disclosed technology relate to systems, devices, circuits, methods, computer-readable media, and techniques for improving the power, performance, and area (PPA) for a voltage mode driver and on die termination (ODT). Example voltage drivers in accordance with the disclosed technology include but are not limited to voltage drivers implemented in memory systems including volatile or non-volatile memory systems, or in any other type of system. Examples of such memory systems include Double Data Rate (DDR) memory, DDR4, LPDDR4, DDR3, NV-DDR3, NV_LPDDR4, and others.

Example embodiments of the disclosed technology include voltage mode drivers in a pull-down design, a pullup design, or both pulldown and pullup designs.

One example embodiment of the disclosed technology is a voltage mode driver having first and second circuits in a pulldown design. The first circuit has a plurality of nMOS devices in parallel, the plurality of nMOS devices being common to a first resistor. The second circuit is in parallel with the first circuit and has an nMOS device in series with a second resistor. The second circuit is configured to be enabled when the pulldown impedance of the first circuit, with the second circuit disabled and all of the nMOS devices of the first circuit turned on, is greater than a desired pulldown impedance.

Another example embodiment of the disclosed technology is a voltage mode driver having first and second circuits in a pullup design. The first circuit has a plurality of pMOS devices in parallel, the plurality of pMOS devices being common to a first resistor. The second circuit is in parallel with the first circuit and has a pMOS device in series with a second resistor. The second circuit is configured to be enabled when the pullup impedance of the first circuit, with the second circuit disabled and all of the pMOS devices of the first circuit turned on, is greater than a desired pullup impedance.

Figure 1:
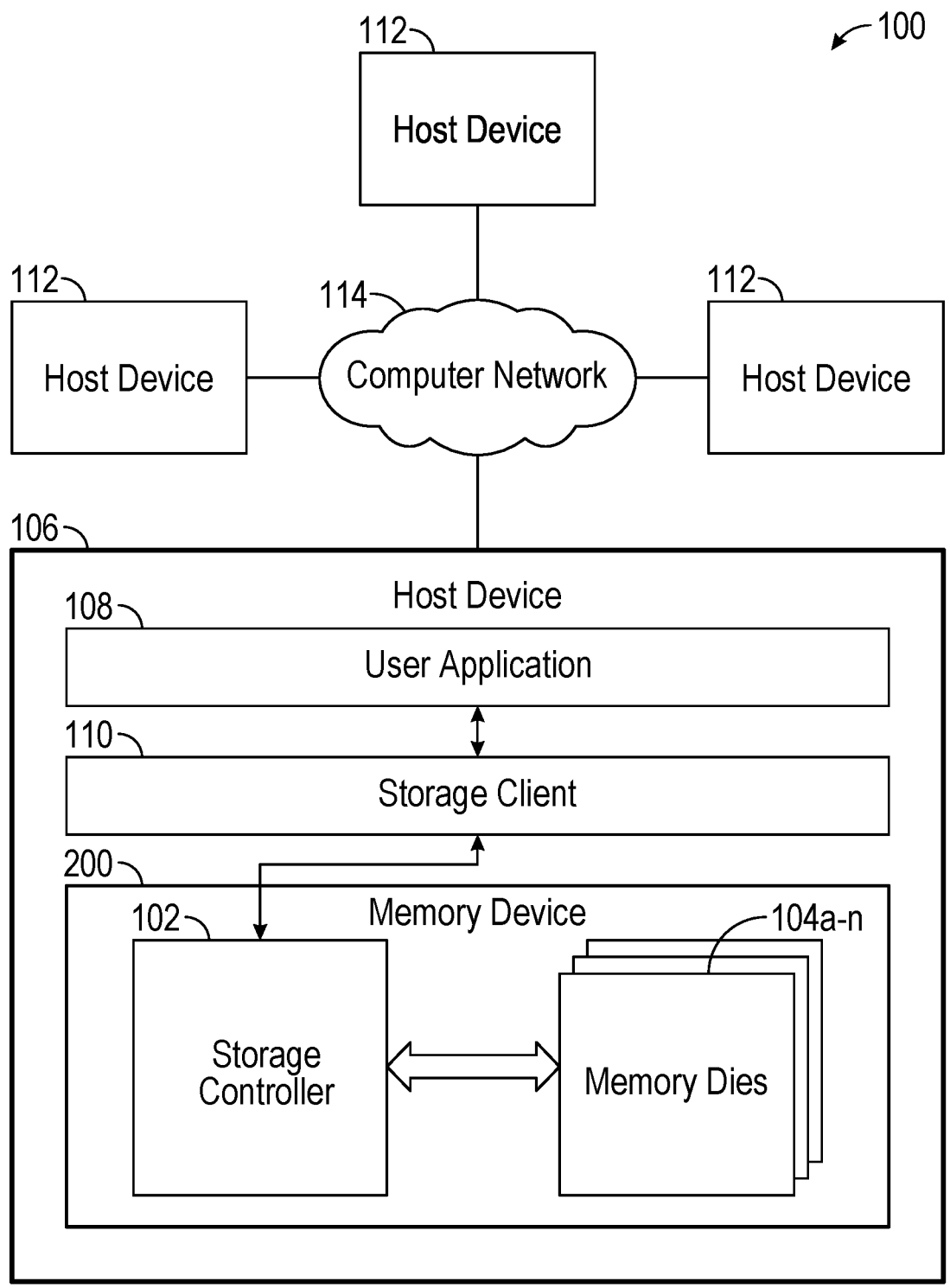
FIG. 1 is a block diagram of an example memory system, in connection with which, example embodiments of the disclosed technology can be implemented.

Technical solutions are realized throughout the application. By virtue of the features of the disclosed technology, increased cost savings can be realized due to driver and pre-driver area reduction. Designs according to example embodiments of the disclosed technology can realize higher performance due to pad-cap reduction and more optimal DC parameters. Due to less static and dynamic current/power, self-heat is reduced. Example embodiments can also have a scalable architecture through adding further resistor/nMOS or resistor/pMOS circuit legs according to the disclosed technology, in order to achieve better performance. The proposed design can be used for most or all voltage mode drivers, e.g., for DDR3, NV-DDR3, DDR4, NV-LPDDR4, LPDDR4, protocols and the like. FIGS. 1-4H FIGS. 1 to 4H depict an example memory system that can be used to implement the technology disclosed herein. Of course, this is just an example implementation and the disclosed technology is not limited to implementing the voltage driver in a memory system. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
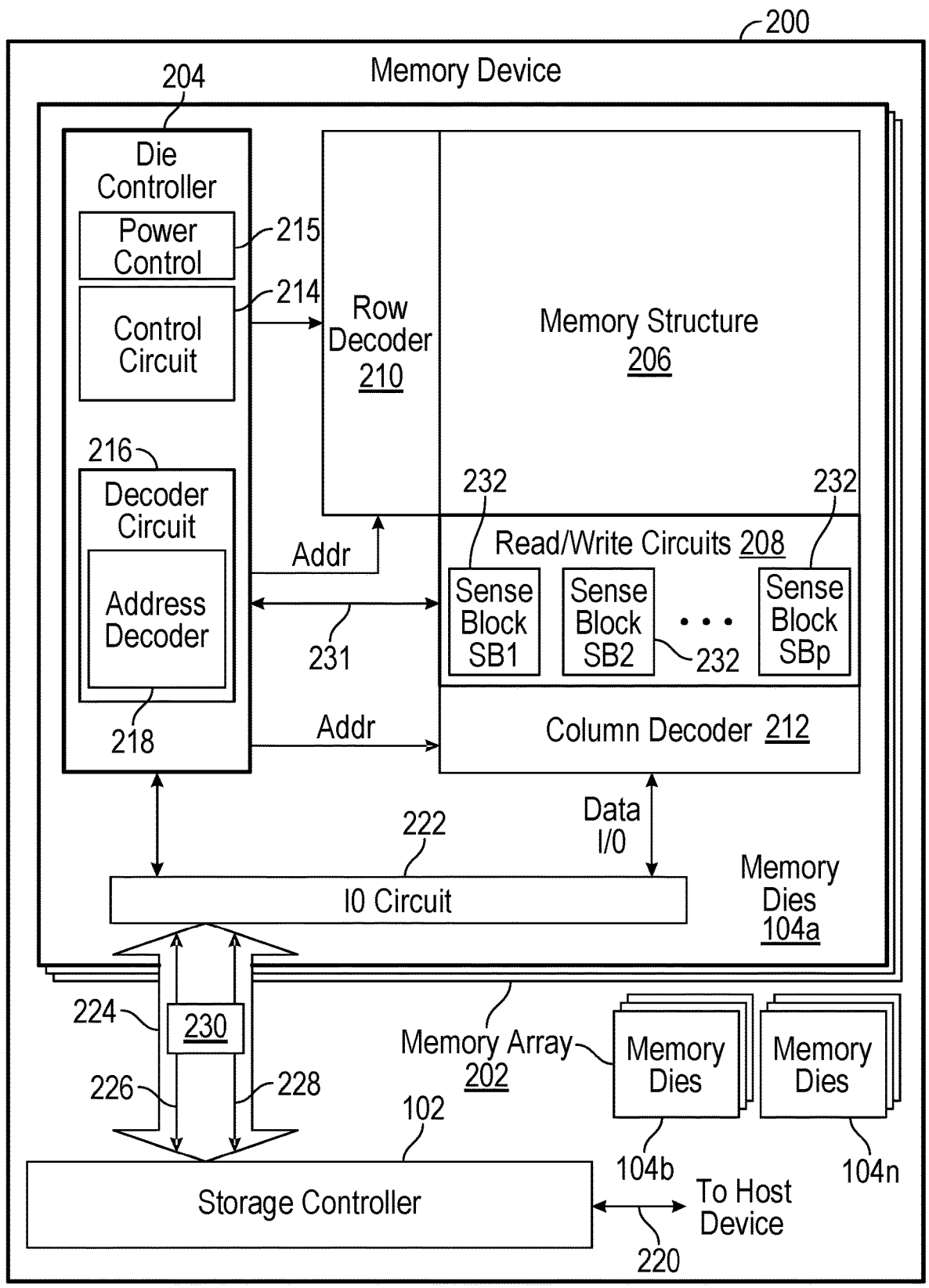
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104a-n, the storage controller 102 and memory dies 104a-n being effectively as described with regard to FIG. 1. Each memory die 104a-n can be a complete memory die or a partial memory die and may include a die controller 204, at least one memory structure 206, and read/write circuits 208. The following description will be made with reference to memory die 104a as an example of memory dies 104a-n, where each memory die may include same or similar components and function in the same or similar way. Thus, while reference herein is made to memory die 104a, the same description may be applied equally to memory dies 104b-n.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D—laid out in a single fabrication plane) or three-dimensional (3D—laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104a. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104a and an address bus over which addresses are transmitted to the memory die 104a. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DOS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DOS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (IO) circuit 222 may be coupled, through the memory interface 224 and to the memory interface circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via memory interface circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
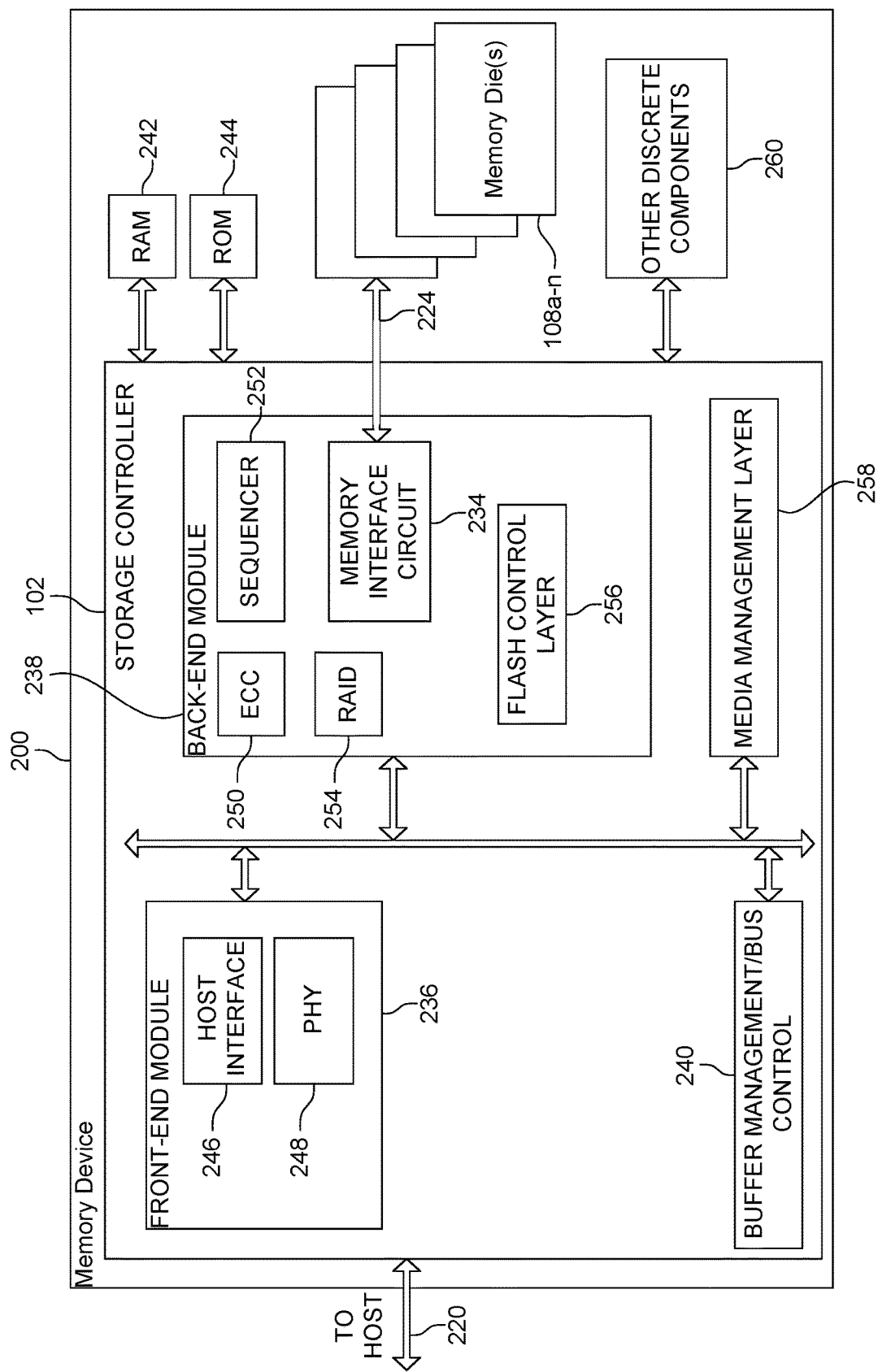
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory die 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the memory interface circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 205 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 2C:
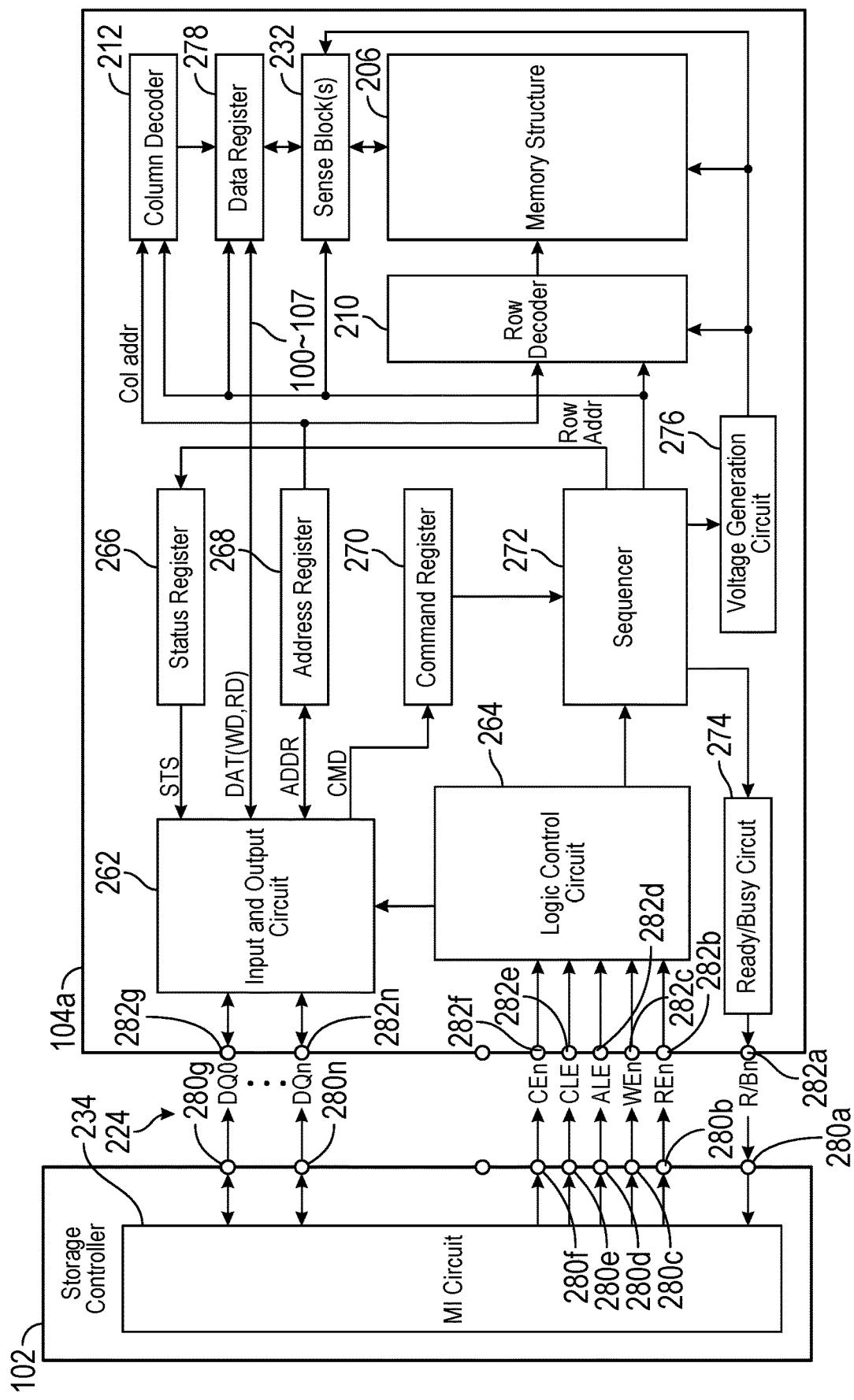
FIG. 2C is a block diagram of example memory system that depicts more details of an example embodiment of memory die, in connection with which, example embodiments of the disclosed technology can be implemented.

FIG. 2C is a block diagram of example memory system 200 that depicts more details of one embodiment of memory die 104a. With reference to FIG. 2B above, the memory die 104a is connected to the storage controller 102 via the memory interface 224 and operates based on commands from the storage controller 102.

For example, the memory die 104a transmits and receives, for example, DQ0 to DQn (hereinafter simply referred to as signals DQ or signals DQ[0:n], where n is an integer of the number of lines) to and from the storage controller 102. The DQ[0:n] signals may be an n-bit wide signal, where each DQ signal is a 1-bit wide signal. In various embodiments, n may be 7, thus DQ[7:0] signals is an 8-bit wide signal. The DQ[0:n] signals may be encoded with input/output (I/O) data, for example, data in (DIN)/data out (DOUT) for data operations (e.g., read operations, write operations, erase operations, etc.) and address data (e.g., address codes) and command data (e.g., command codes) for command/address sequencing of for the data operations. Data sent over the DQ[0:n] signals is latched with respect to a rising edge or a falling edge of a clock signal or data strobe (DQS) signal. In a single data rate ("SDR") mode, the data is latched on either the rising edge or the falling edge of the clock signal. In a double data rate ("DDR") mode (also referred to herein as toggle mode), the data is latched on both the rising and falling edges of the clock signal.

The memory die 104a also receives control signals, such as, but not limited to, CEn signal, CLE signal, ALE signal, WEn signal, REn signal, DQS signal, and the like from the storage controller 102 via the control bus 226 of the memory interface 224. Then, the memory die 104a also transmits control signals, for example but not limited to, a ready/busy signal (R/Bn) to the storage controller 102. In some embodiments, each of control signals may be a one-bit wide signal. In other embodiments, the control signals may have other bit-widths as desired.

The CEn signal is a signal for enabling the memory die 104a. In various embodiments, the CEn signal is an active-low CEn, such that the CEn is asserted at a logic LOW level (e.g., logic level 0 or low voltage (0 volt)) to enable the memory die 104a. A memory array 202 may include a plurality of memory dies 104, each of which may be substantially similar to memory die 104a and activated based on receiving the CEn signal. In some embodiments, memory dies that are not used for a specific task may remain in a standby state. In the standby state, the memory dies do not respond to control signals from the storage controller 102. After asserting the CEn signal, the activated memory die starts responding to the control signals from the storage controller 102. For example, when the storage controller 102 desires to activate memory die 104a, the storage controller 102 asserts the CEn signal at a logic LOW level.

The CLE signal is an active-high signal, according to various embodiments, for enabling command sequencing, for example, by indicating that the DQ[0:n] signal is encoded with a command code (also referred to as CMD) and is asserted, for example, at a logic HIGH level (e.g., logic level 1 or high voltage (e.g., 5 volts)), according to some embodiments. The CLE signal may be used to activate a command bus (e.g., of control bus 226) between the storage controller 102 and the memory die 104a, for example, when the CLE signal is asserted at a logic HIGH level.

The ALE signal is an active-high signal, according to various embodiments, for enabling address sequencing, for example, by indicating that the signal DQ is encoded with an address code (also referred to as ADDR) and is asserted, for example, at the logic HIGH level. The ALE signal may be used to activate an address bus (e.g., of control bus 226) between the storage controller 102 and the memory die 104a, for example, when the ALE signal is asserted at a logic HIGH level.

When the memory die 104a receives the ALE signal that is at a logic LOW level and the CLE signal that is at a logic HIGH level, the memory die 104a knows that the storage controller 102 is sending command data on the DQ[0:n] signals, which is latched into a command register 270. Similarly, when the memory die 104a receives the ALE signal at a logic HIGH level and the CLE signal at a logic LOW level, the memory die 104a knows that address data is being sent by the storage controller 102 and the address data is latched into an address register 268 of the memory die 104a.

The WEn signal is a clock signal for sampling a received signal into the memory die 104a. For example, a signal received by the memory die 104a is sampled and latched at each rising or falling edge of the WEn signal to obtain a bit pattern encoded into the received signal. Accordingly, DQ[0:n] signals are received in the memory die 104a when the WEn signal is toggled. For example, command data and/or address data sent to the memory die 104a may be latched with respect to a rising edge and/or a falling edge of the WEn signal. In various embodiments, WEn signal may be latched in SDR mode or DDR mode.

The REn signal is a signal used for the storage controller 102 to read data from the memory die 104a. For example, data is read out of the memory die 104a at each rising or falling edge of the REn signal. Accordingly, the memory die 104a outputs the DQ[0:n] signals to the storage controller 102 based on the toggled REn signal. The R/Bn signal is a signal indicating whether the memory die 104a is in a busy state or a ready state (in a state in which a command is not receivable or receivable from the storage controller 102) and is considered to be at the logic LOW level, for example, when the memory die 104a is in the busy state.

While the above example provides the CEn signal as an active-low signal and the CLE and ALE signals as active-high signals, other implementations are possible. In some embodiments, the active states may be reversed. For example, the CEn signal may be an active-high signal and the CLE and ALE signals may be active-low signals.

The storage controller 102 issues a command to perform a read operation, a command to perform a write operation, a command to perform an erase, or the like to the memory die 104a in response to a command from a host device (e.g., host device 106 and/or 112). The storage controller 102 manages the memory space of the memory die 104a. As part of the read, write, or erase operations, the memory die 104a issues various commands to perform command/address sequencing for a respective operation and the memory die 104a and/or storage controller 102 transmit DIN/DOUT to complete the respective operation.

As described above, the memory interface circuit 234 of the storage controller 102 connects to the input/output circuit 222 of the memory die 104a via a plurality of electrical contacts. As used herein, electrical contacts may be referred to as pins or pins of a chip for electrically connecting the memory die 104a to the storage controller 102. For example, the storage controller 102 includes a plurality of pins 280a-n electrically connected to a plurality of pins 282a-n of the memory die 104a. The memory interface circuit 234 transmits the CEn signal, CLE signal, ALE signal, and WEn signals to the memory die 104a over the control bus 226 of the memory interface 224 via respective pins and transmits DQ [0:n] signals over the data bus 228 of the memory interface 224 via respective pins. The input/output circuit 222 transmits the R/Bn signal to the storage controller 102 over the control bus 226 and the DQ [0:n] signals over the data bus 228 via respective pins. The pins may also be referred to as receivers or transmitters. For example, where a signal is transmitted from a pin on the storage controller to a pin of the memory die, the transmitting pin may be referred to as an transmitter and the receiving pin may be referred to as a receiver. Each pin may be referred to as either a receiver or output transmitted based on the scenario, for example, one pin may transmit at a first instance while the pin may also receive at a second instance.

As illustrated in FIG. 2C, the memory die 104a includes an input and output circuit 262, a logic control circuit 264, a status register 266, an address register 268, a command register 270, a sequencer 272, a ready/busy circuit 274, a voltage generation circuit 276, and a data register 278. The various components 262-278 may be included as part of the die controller 204, for example, as part of the control circuit 214 and/or decoder circuit 216. FIG. 2C also illustrates the memory structure 206, row decoder 210, a sense blocks 232, and column decoder 212, as described above in connection with FIG. 2B.

The input and output circuit 262 controls input and output of the DQ [0:n] signals to and from the storage controller 102. For example, the input and output circuit 262 transmits data received from the storage controller 102 as DIN to data register 278, transmits an address code to the address register 268, and transmits a command code to the command register 270. DIN, the command code, and the address are transmitted to the memory die 104a as DQ [0:n] signals encoded with a bit pattern for the DIN, command, or address. The input and output circuit 262 also transmits status information STS received from the status register 266, data received from the data register 278 to be transmitted to the storage controller 102 as DOUT. STS and DOUT are transmitted as DQ [0:n] signals encoded with a bit pattern for the STS or DOUT. The input and output circuit 262 and the data register 278 are connected via a data bus. For example, the data bus includes eight I/O data lines 100 to 107 corresponding to the 8-bit signals DQ0 to DQ7. The number of I/O data lines is not limited to eight, but may be set to 16, 32, or any number of data lines.

The logic control circuit 264 receives, for example, the CEn signal, the CLE signal, the ALE signal, the WEn signal, and the REn signal from the storage controller 102 via control bus 226. Then, logic control circuit 264 controls the input and output circuit 262 and the sequencer 272 in accordance with a received signal.

The status register 266 temporarily stores status information STS, for example, in a write operation, a read operation, and an erasing operation for data and notifies the storage controller 102 whether the operation normally ends.

The address register 268 temporarily stores the address code received from the storage controller 102 via the input and output circuit 262. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be an address code. The address code is then temporarily stored in the address register 268. Then, the address register 268 transmits a row address (row addr) to the row decoder 210 and transmits a column address (col addr) to the column decoder 212.

The command register 270 temporarily stores the command code received from the storage controller 102 via the input and output circuit 262 and transmits the command code to the sequencer 272. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be a command code. The command code is then temporarily stored in the command register 270.

The sequencer 272 controls operation of the memory die 104a. For example, the sequencer 272 controls the status register 266, the ready/busy circuit 274, the voltage generation circuit 276, the row decoder 210, the sense blocks 232, the data register 278, the column decoder 212, and the like according to a command code stored in the command register 270 to execute the write operation, the read operation, and the erasing operation according to the code.

The ready/busy circuit 274 transmits the R/Bn signal to the storage controller 102 according to an operation state of the sequencer 272. For example, the R/Bn signal is transmitted to the storage controller 102 via the control bus 226 of the memory interface 224.

The voltage generation circuit 276 generates a voltage necessary for an operation (e.g., a write operation, a read operation, or an erasing operation) according to control of the sequencer 272. The voltage generation circuit 276 may be an example of the power control circuit 215 of FIG. 2A. The voltage generation circuit 276 supplies the generated voltage, for example, to the memory structure 206, the row decoder 210, and the sense blocks 232. The row decoder 210 and the sense blocks 232 apply a voltage supplied from the voltage generation circuit 276 to memory cells in the memory structure 206. Details of the memory structure 206 are provided in connection with FIGS. 3-4G below.

The data register 278 includes a plurality of latch circuits. The latch circuit stores the write data WD and the read data RD. For example, in a write operation, the data register 278 temporarily stores the write data WD received from the input and output circuit 262 and transmits the write data WD to the sense blocks 232. For example, in a read operation, the data register 278 temporarily stores the read data RD received from the sense blocks 232 and transmits the read data RD to the input and output circuit 262.

Figure 3:
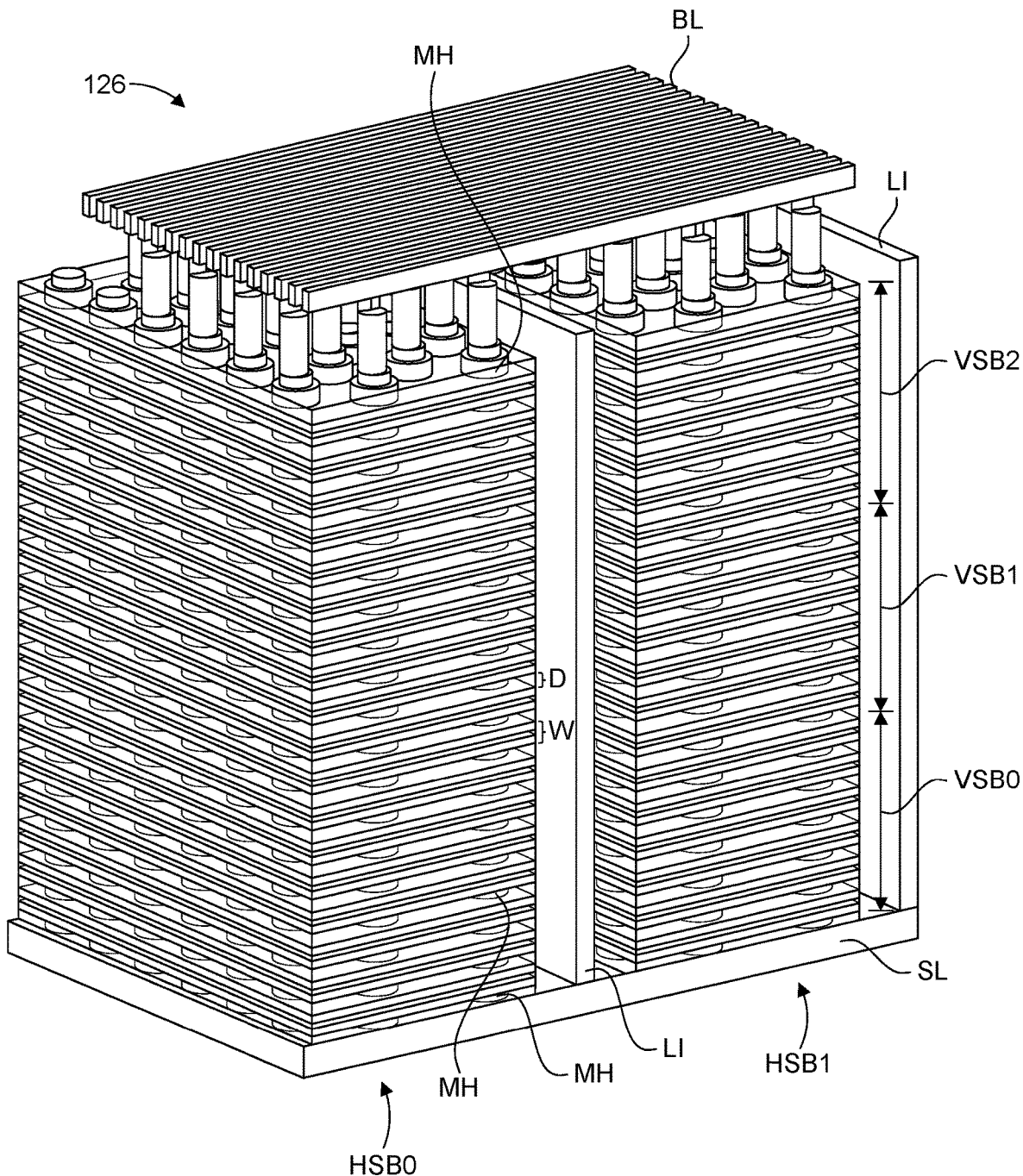
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
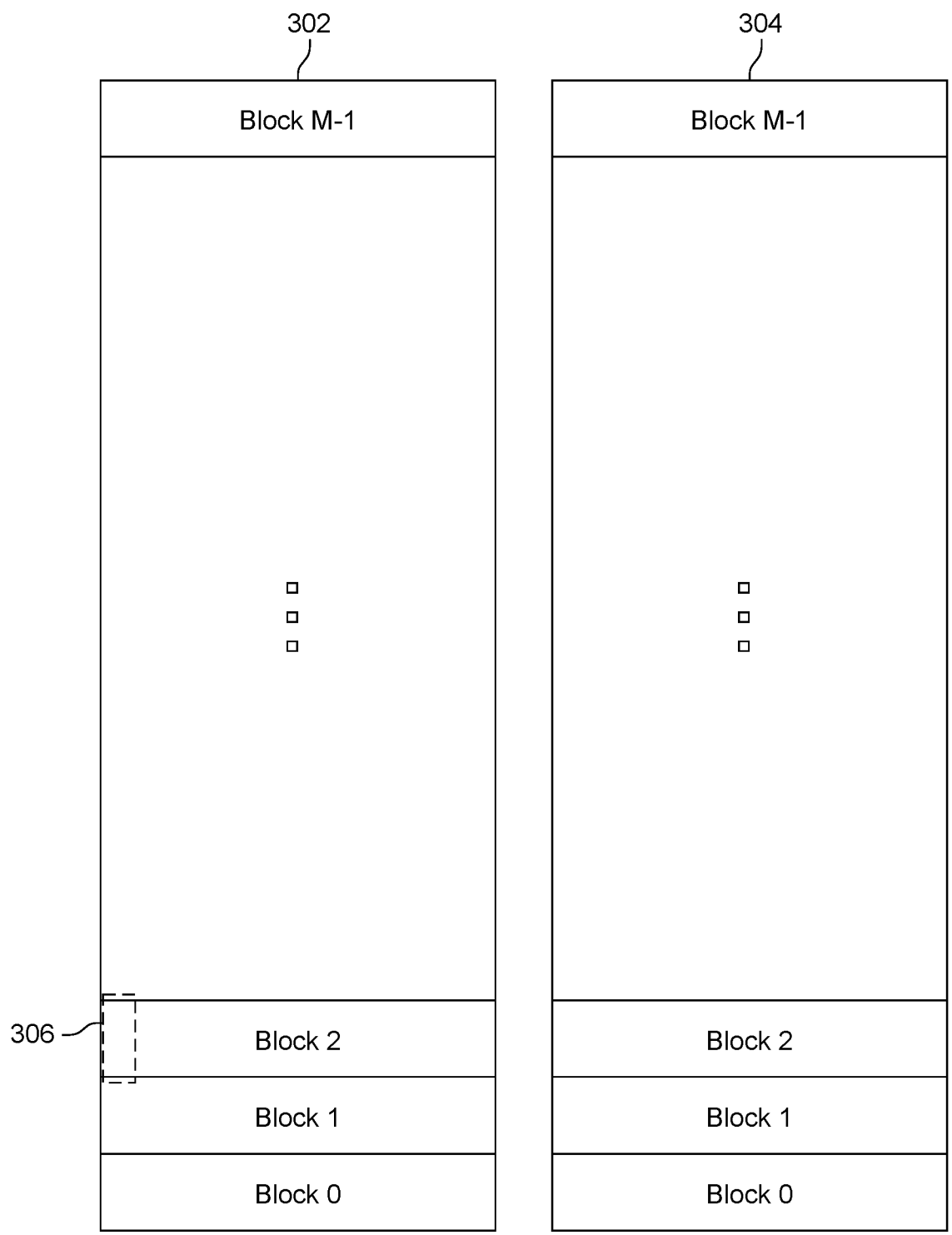
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

Figure 4B:
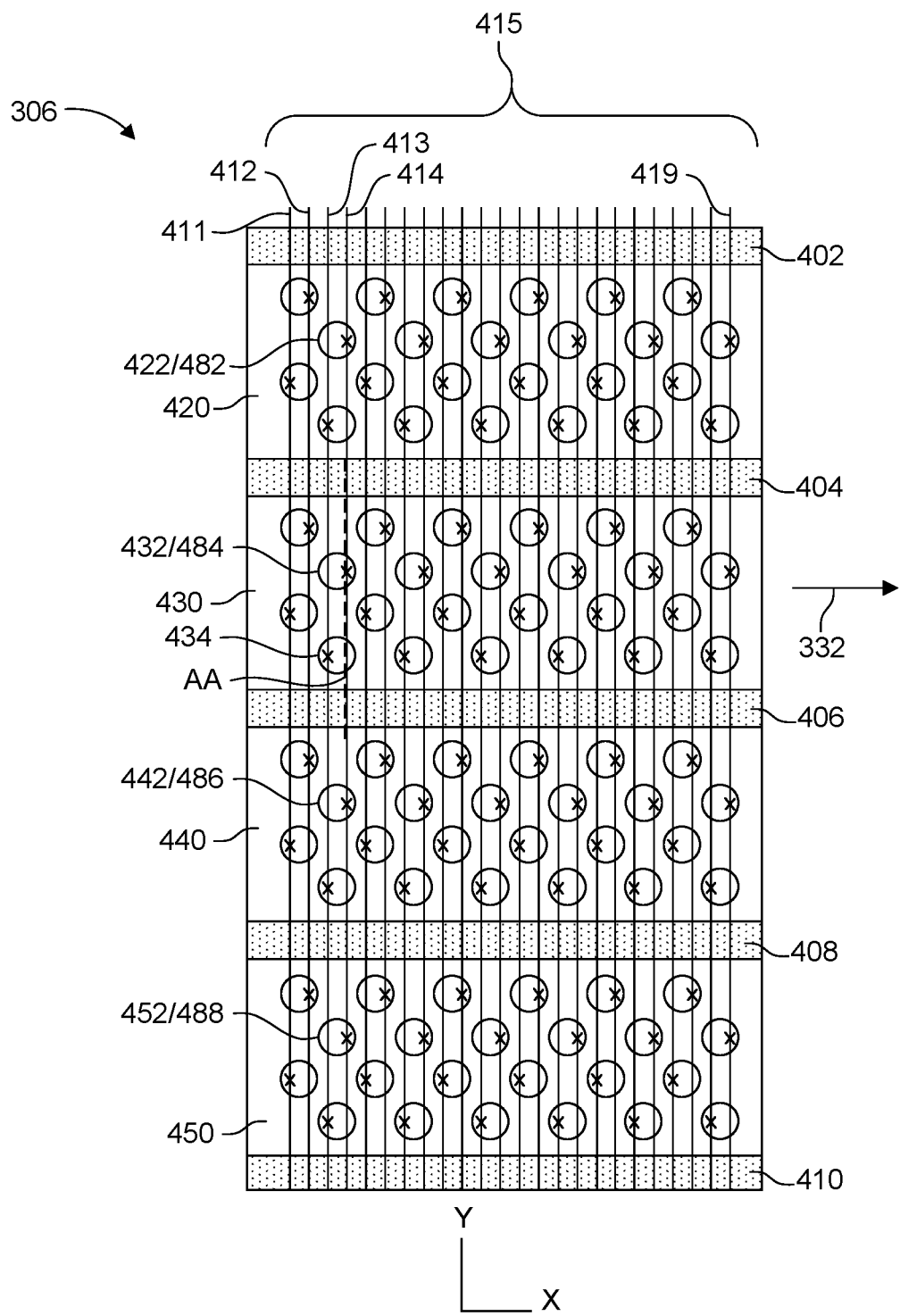
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
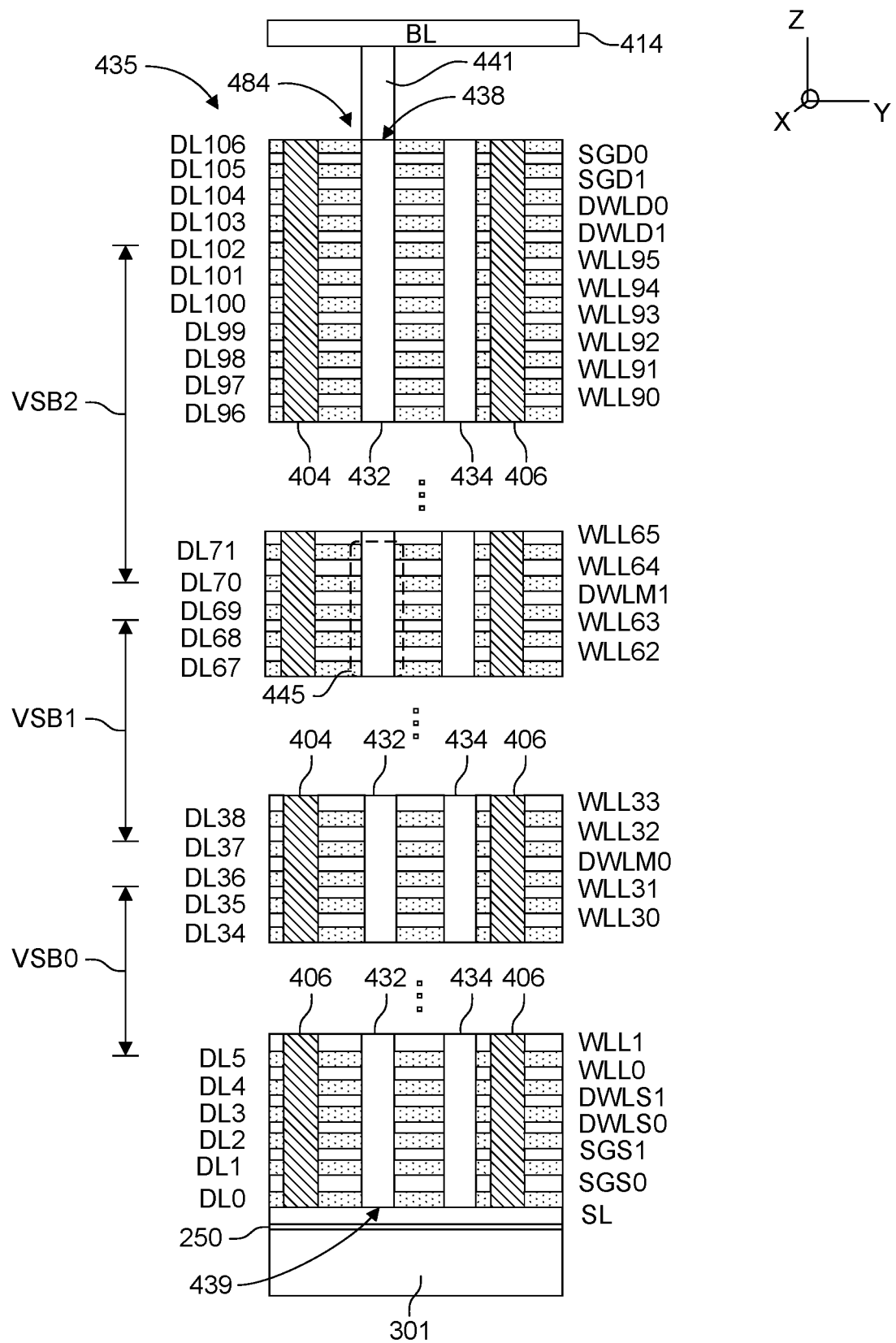
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
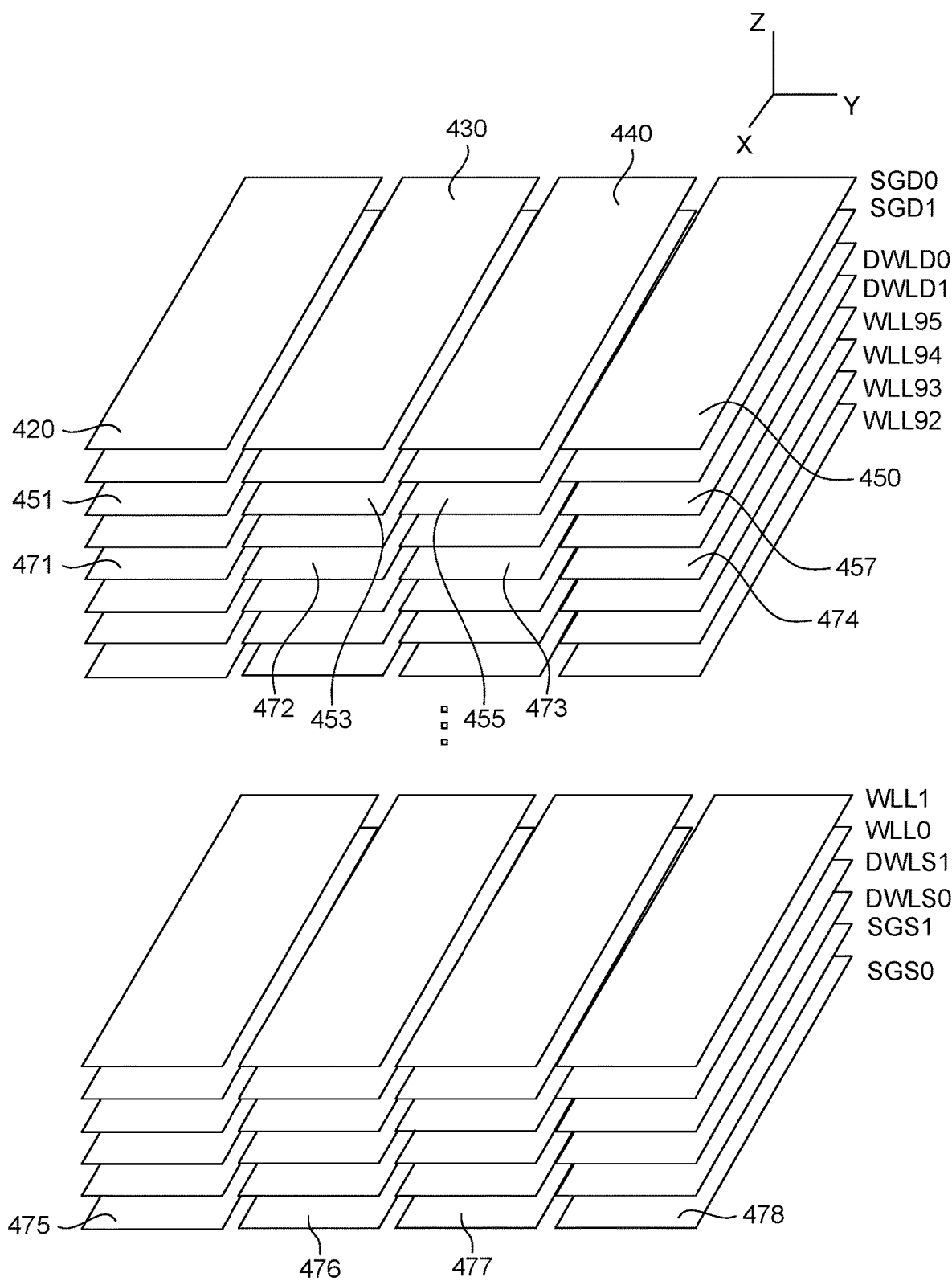
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
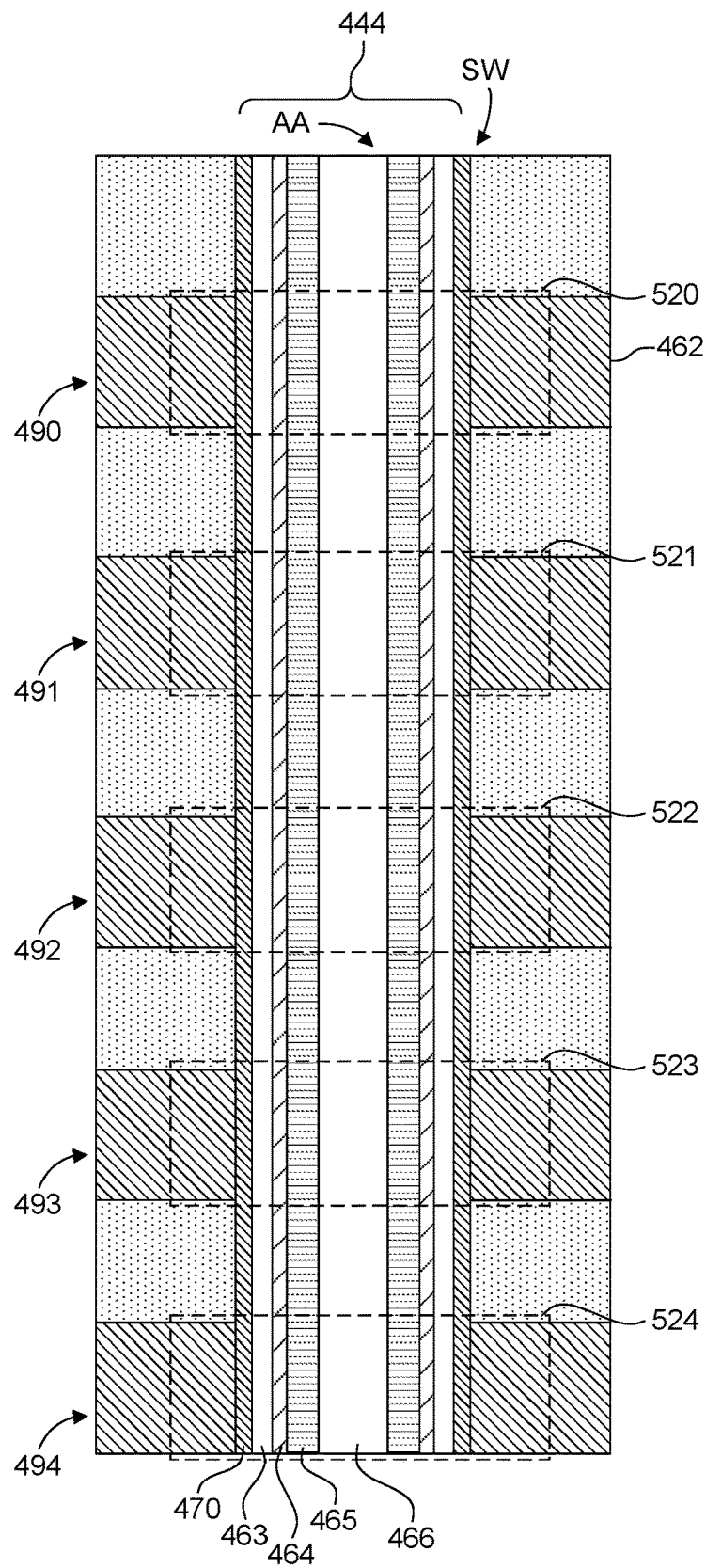
FIG. 4E depicts a view of a region of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
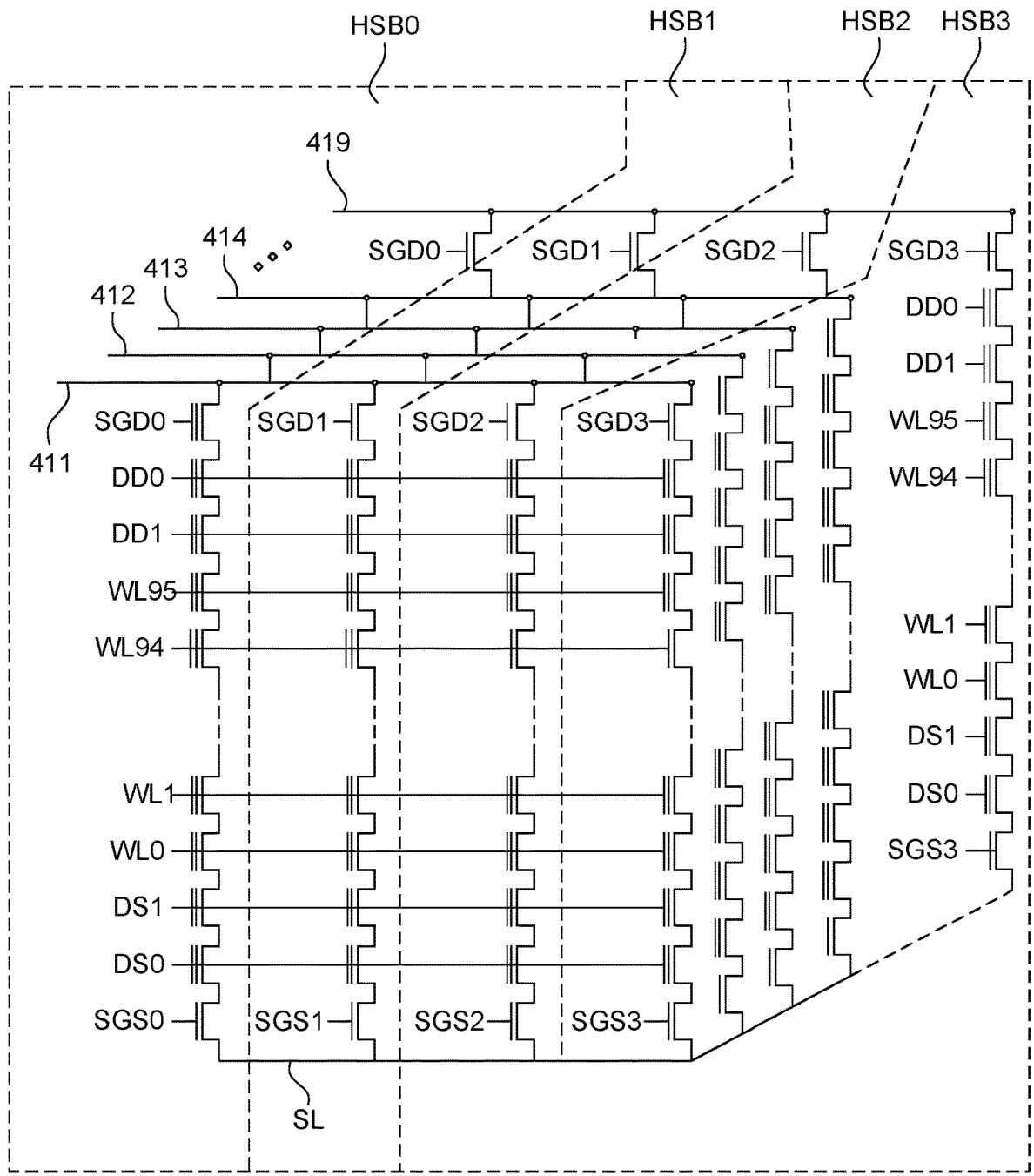
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, ... 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
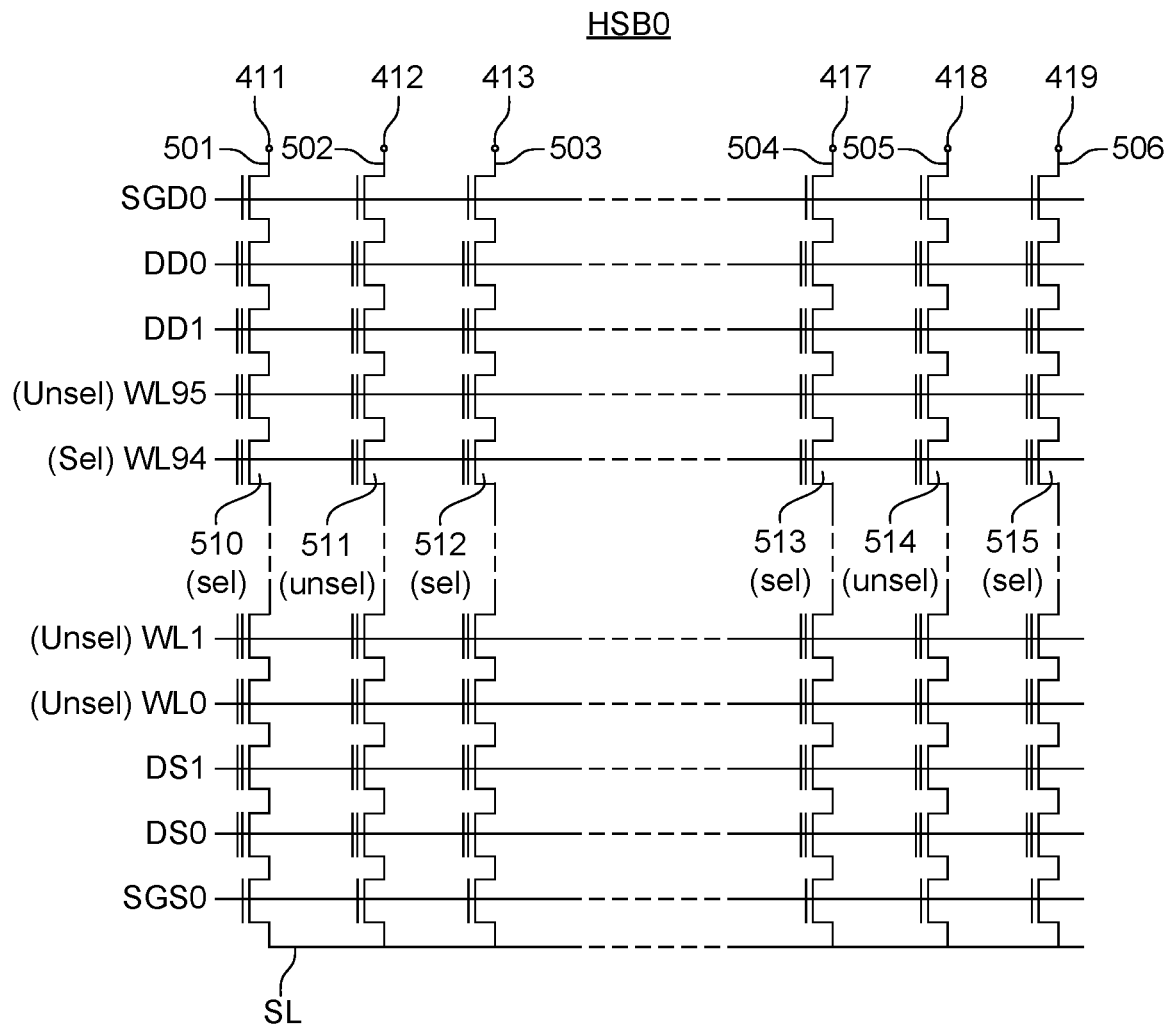
FIG. 4G is a schematic of a plurality of NAND strings showing one example horizontal sub-block, in connection with which, example embodiments of the disclosed technology can be implemented.
Figure 4H:
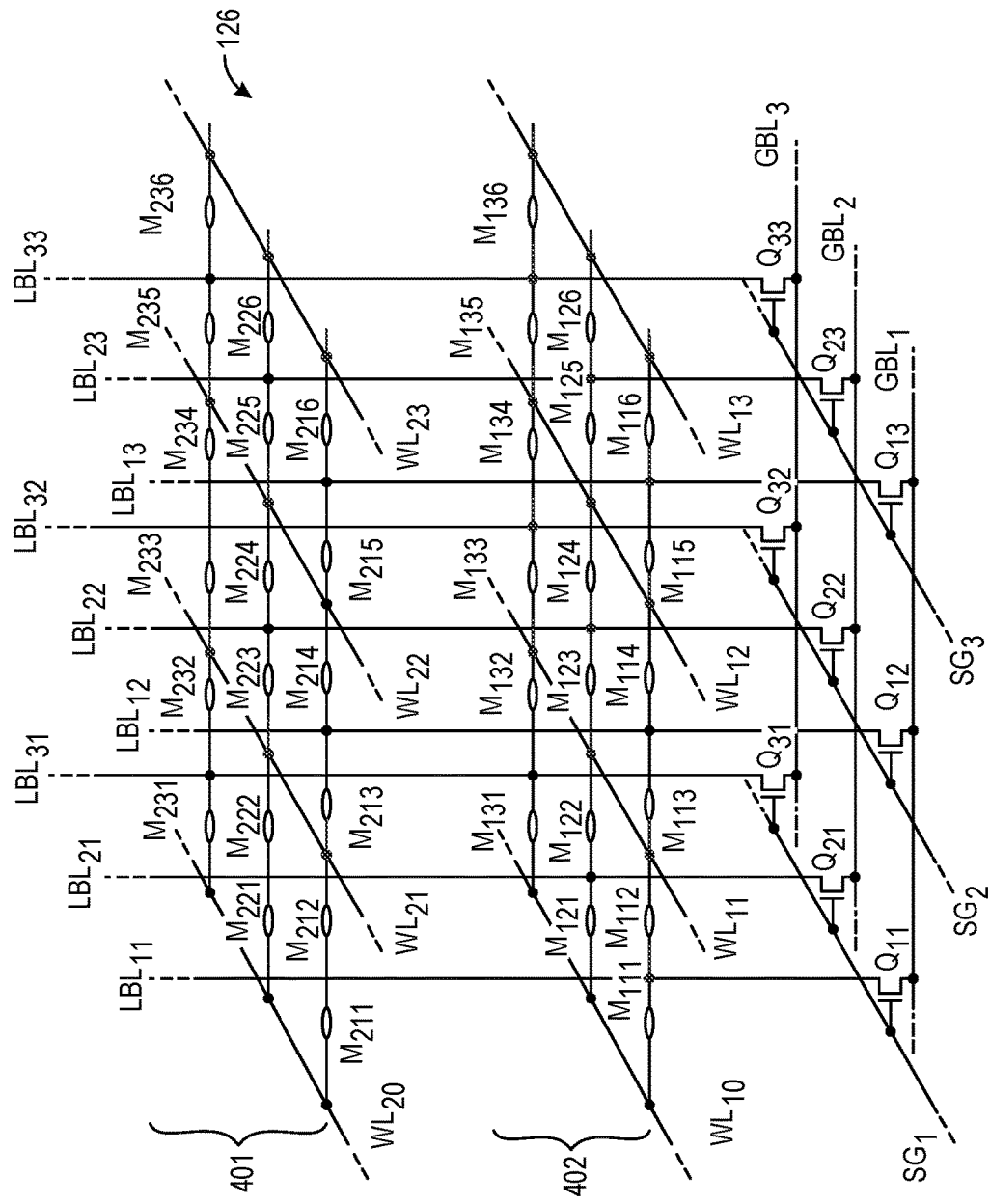
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

FIG. 4H illustrates another memory structure that can be used for the structure 126 of FIG. 1A. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Historically, power, performance, and area (PPA) have been main variables used in deciding how to optimize semiconductor designs. Achieving high speed for a voltage mode driver used for protocols such as DDR4, LPDDR4, DDR3, NV-DDR3, NV_LPDDR4 and others can be challenging as supply voltage is low, 1.1V/1.2V being typical. It can be even more challenging to obtain desired performance with planner MOSFET technologies where the threshold voltage of devices can be up to 750 mV and poly resistor variation can be up to ±26% (see, e.g., TSMC 28 nm HPC process technology). For driver design, it is required to keep parameters like padcap, quantization error, and linearity within limits to achieve desired performance with given power and area/cost. Tradeoff exists between these parameters such that if one parameter is improved, one or more of the other parameters tend to degrade, which can lead to reduced performance with higher power and cost/area.

Figure 5:
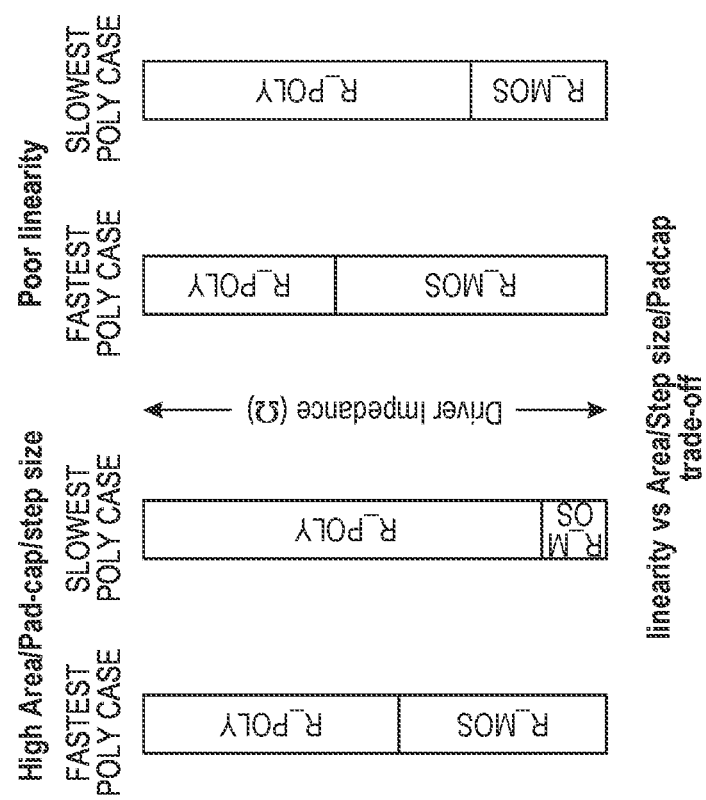
FIG. 5 shows an example of tradeoff that exists in driver design between linearity and pad-cap/step-size/area.

In general, a poly resistor is used in series with pMOS/nMOS logic to build driver pull-up/pull-down segments (PU/PD) in high-speed voltage-mode driver designs to make these designs linear. An example of tradeoff that exists in driver design between linearity and pad-cap/step-size/area is shown in FIG. 5. In the example of FIG. 5, contributions of poly resistor and MOS logic to driver impedance is shown, in the fastest/slowest poly cases with good linearity and the fastest/slowest poly cases with poor linearity. If linearity is targeted for improvement, then one or more of pad-cap, step-size, and area tend to increase, and vice versa.

With regard to fast and slow cases, in general, process-induced variations in electrical components that make up a voltage mode driver may provide for variations in electrical properties between physical implementations of the voltage mode driver. For example, variations in physical properties of electrical components due to manufacturing tolerances (e.g., semiconductor doping levels and concentrations, device sizes, etc.) may translate to differences between each real world physical implementation of a voltage mode driver. Dopant concentration of transistors may fluctuate within manufacturing tolerances that may translate to differences in threshold voltages, which can impact the operation of a voltage mode driver. The process induced variations are characterized as a plurality of process corners for each electrical component, for example, a fast (F), slow (S), and typical (T) corner. Each device has its own corners, and when the components are combined into a single circuit the number of corners increases to cover all variations. For example, an n-channel MOSFET (nMOS) transistor may have F, S, and T corners and a p-channel MOSFET (pMOS) may also have a F, S, and T corners.

On-die termination (ODT), referenced above, is the technology where the termination resistor for impedance matching in transmission lines is located inside a semiconductor chip instead of on a printed circuit board (PCB). Incorporating a resistive termination within the DRAM device can improve the signaling environment by reducing the electrical discontinuities introduced with off-die termination. Specifically, on-die termination (ODT) can be used for improving signal integrity by minimizing signal reflection at an interface between a system and a memory device. Signal reflection more significantly degrades signal integrity in a memory system having high-speed operations.

Figure 7:
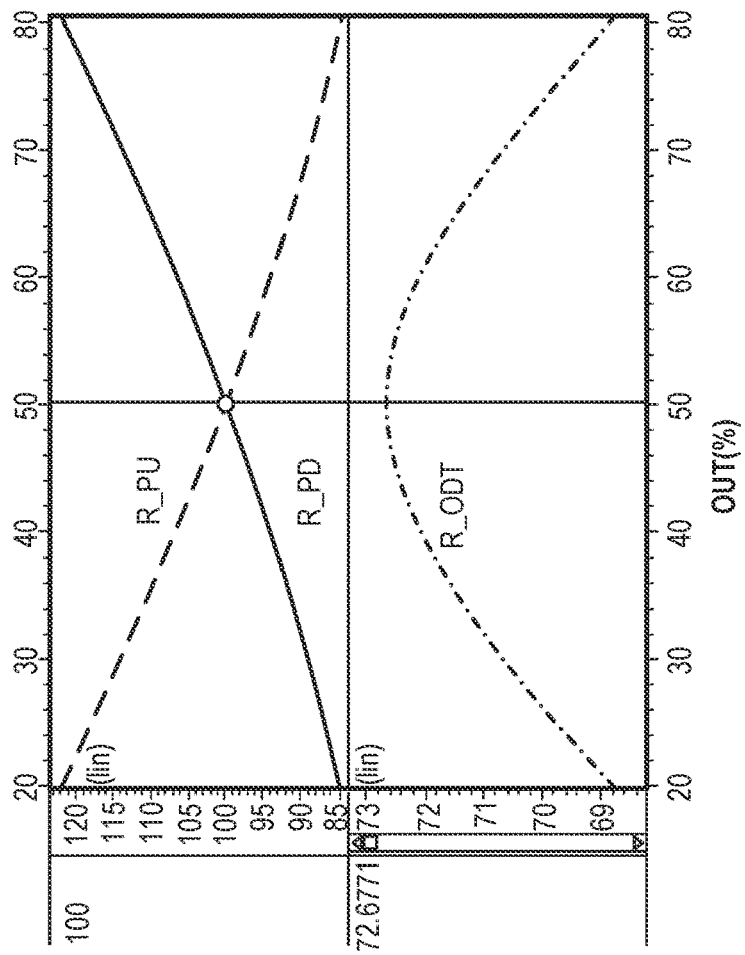
FIG. 7 shows an example waveform illustrating that ODT can be non-ideal due to non-linearity of either R_PU and/or R_PD.
Figure 6:
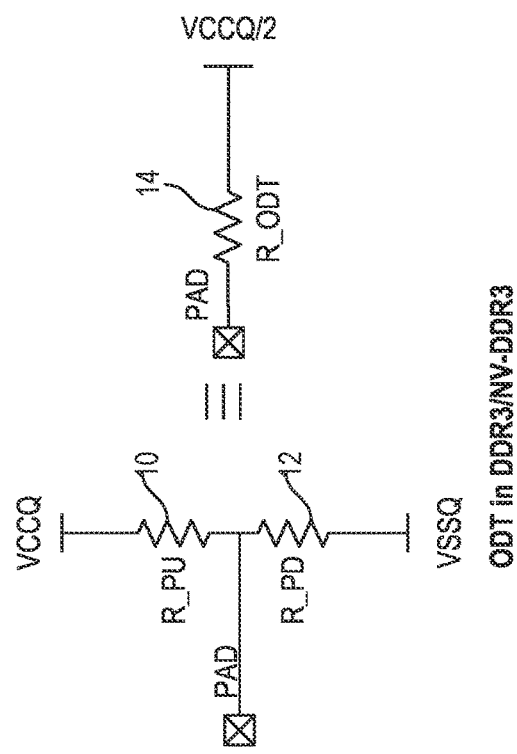
FIG. 6 is a circuit diagram illustrating the principle that an R_PU and R_PD resistor can be modeled as an ODT resistor.

In read mode, an existing driver is used as ODT to save area and improve performance. The value and linearity of ODT is important to signal integrity. In DDR3 and NV-DDR3 for example, Thevenin ODT is used where driver pull-up and pull-down segments are turned on to realize ODT to VCCQ/2 as shown in FIG. 6. FIG. 6 illustrates that the R_PU and R_PD resistors 10, 12 respectively can be modeled as the ODT resistance R_ODT 14. For Thevenin ODT, the ideal value of R_ODT=(R_PU∥R_PD). As an example, if 50Ω ODT is required to VCCQ/2 then pull-up impedance (R_PU) and pull-down impedance (R_PD) should be 100Ω each. A disadvantage of Thevenin ODT is that even if R_PU and R_PD are accurately calibrated at VCCQ/2, the ODT value could be non-ideal due to non-linearity of either R_PU or R_PD or both. An example of this is shown in Waveform 1 of FIG. 7, where R_PU and R_PD are each 100Ω at VOUT=50% of VCCQ but RODT=72.67Ω instead of 50Ω.

To check the impact of non-linear R_PU and R_PD on R_ODT, R_PU and R_PD can be modeled using following equation where $\alpha$ and $\beta$ are constants, $V_R$ is voltage across resistor, and $R_{min}$ is minimum values of resistance when $V_R$ is 0:

$$R\_PU/R\_PD = (R_{min} + \alpha(V_R)^{-\beta})$$

Simulation was done with different values of $\alpha$, $\beta$, and $R_{min}$ and data results are entered in Table 1 shown in FIG. 8. In Table 1, R_PU=R_PD=100Ω without considering any calibration error. As shown in Sr. No. 1 of Table 1, R_ODT changes significantly with non-linear R_PU and R_PD. For Sr. No. 11 in Table 1, R_ODT increases by approximately 88% which is detrimental for signal quality at the receiver end.

To improve signal quality, R_ODT can be set to its desired value by reducing the R_PU and R_PD values. For example, to set R_ODT in Sr. No. 11 of table 1 to 50Ω (from approximately 94Ω), R_PU and R_PD can be reduced to 53Ω (from 100Ω). Conventionally this can be done only if there are extra driver segments available in the circuit design to reduce R_PU and R_PD. If not, extra pull-up and pull-down legs are required to be added, which results in higher area, padcap, and power (static as well as dynamic). Even if those are available, DC current from the supply increases as R_PU/R_PD decreases {I_VCCQ=VCCQ/(R_PU+R_PD)}, as shown in the last column of Table 1 in FIG. 8. Accordingly it can be concluded from the above analysis that: (1) a correct ODT value is essential to signal quality, (2) linearity of R_PU and R_PD is very important in configuring the correct ODT, and (3) non-linear R_PU/R_PD results in extra power (static and dynamic) and area to set the desired ODT.

Figure 10:
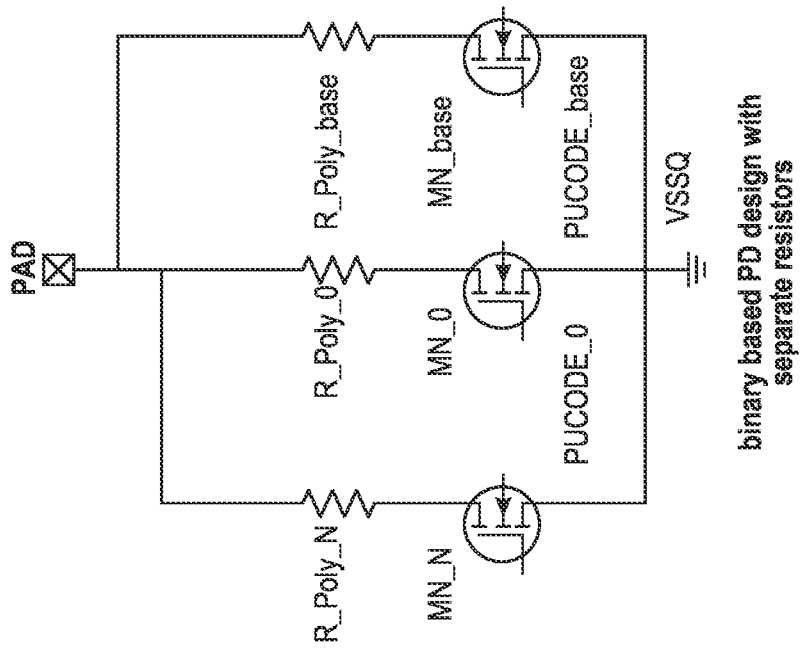
FIG. 10 shows a binary-based driver pull-down (PD) design with separate resistors.
Figure 9:
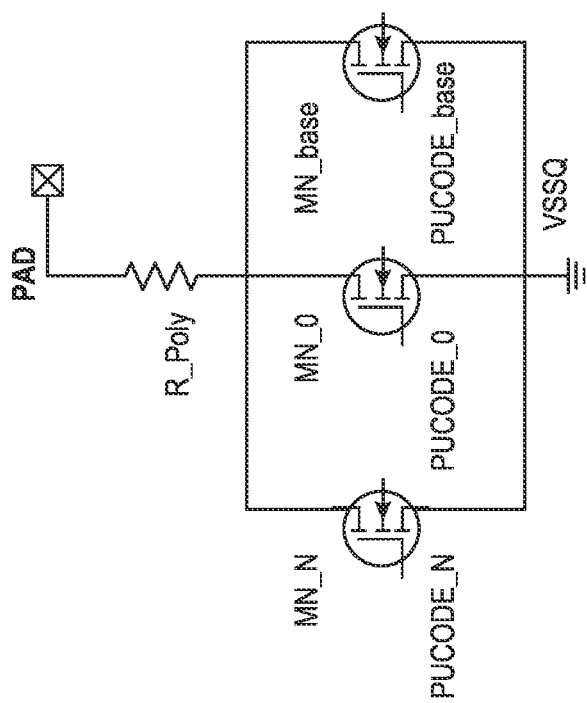
FIG. 9 shows a binary-based driver pull-down (PD) design with a common resistor.

FIGS. 9 and 10 show conventional driver designs. FIG. 9 shows a binary-based driver pull-down (PD) design with a common resistor (R_poly). FIG. 10 shows a binary-based driver pull-down (PD) design with separate resistors (R_poly_base, R_poly_0, . . . , R_poly_N). It is noted that while driver pull-up design is a mirror of driver pull-down design, only driver pull-down design is shown in FIGS. 9 and 10 for analysis. In these circuit designs, R_poly is used to achieve the desired linearity while the desired impedance can be set by calibrating MN* nMOS devices. However, these designs have limitations which can cause technical problems, as follows.

First, as an example, for a DDR4 interface, IO should work for supply (VDDQ) range from 1.14V to 1.26V, and transmitter pull-down (PD) should be linear for drain to source voltage (VDS) up to 1.386V (1.1*1.26V). In a TSMC 28 HPC process, for example, poly resistor variation can be controlled to approximately +−24% with feasible length. In addition, the threshold voltage of NMOS can go up to 750 mV for the SS, −40 C case. This process limitation can result in either a linearity violation or a higher quantization error (step size error); that is, this process limitation can result in a DC impedance problem even after calibration, as well as padcap and area problems for driver pull-down if a binary-based driver structure is used with a common resistor as shown in FIG. 9. As explained above, if the linearity specification is targeted with conventional driver PD design as in FIG. 9, the poly resistor contribution can be expected to be high which can result in high area, padcap, and/or step-size.

Table 2 in FIG. 11 shows an example of a linearity specification for DDR4 driver pull-down (PD). This specification example shows that if driver PD is calibrated (at Vout=80% of VDDQ) to exactly 240Ω for example, then output resistance changes due to the allowed Vout change can be reduced to a minimum of 80% and increased to a maximum of 125%. Now consider Table 3 shown in FIG. 12. If calibration error budget (at Vout=80% of VDDQ) is taken as 4% due to errors such as driver quantization error, comparator offset error, external precision resistor error, etc., then the range shown in Table 2 for linearity shrinks as shown in Table 3.

To meet this specification using the design in FIG. 9, resistance contribution from the nMOS devices cannot exceed 38% of desired resistance (240Ω) based on DC simulation data for a TSMC 28 nm HPC process. Therefore at least 62% resistance contribution should come from the poly resistor (R_poly) to meet the linearity specification. The poly resistor ratio from minimum resistance to maximum resistance is approximately 1.24/0.76=1.63, as poly resistance variation is roughly+−24% across process, voltage, and temperature (PVT). Thus, if NMOS size is kept very large and most of the contribution (240Ω) of segment resistance is coming from the poly resistor (R_poly) in a "slow" poly case, then in a "fast" poly corner R_poly=240/1.6=150Ω which is approximately 63% of 240Ω. Therefore, in that case, MOS contribution would be 37%, which barely meets the linearity specification; and in this case MOS size would tend to increase dramatically in the slowest case which is not practical as it can lead to very high pad-cap and quantitation error.

FIG. 10 shows a conventional binary-based driver structure with separate poly resistors (R_poly_base, R_poly_), . . . , R_poly_N). If a binary-based driver structure is used with separate resistors as shown in FIG. 10, the area of the driver tends to increase dramatically as many resistors are used and the EM requirement must be meet separately for each of them. This would lead to a resistor area increase of approximately 5×. Accordingly, limitations of existing driver design for a DDR4 driver pull-down are explained above. Similar limitations would apply to DDR4 driver pull-up and most or all other voltage mode drivers. Also as shown in Table 1, since driver linearity is a limitation of existing designs, ODT value would likely degrade for DDR3, NV-DDR3 protocol which tends to result in poor signal quality at the receiver input.

The disclosed technology provides improved driver/ODT design along with the ZQ scheme to meet desired operation speed at lower area and power. The disclosed technology can be used for most or all voltage mode drivers.

Figure 13:
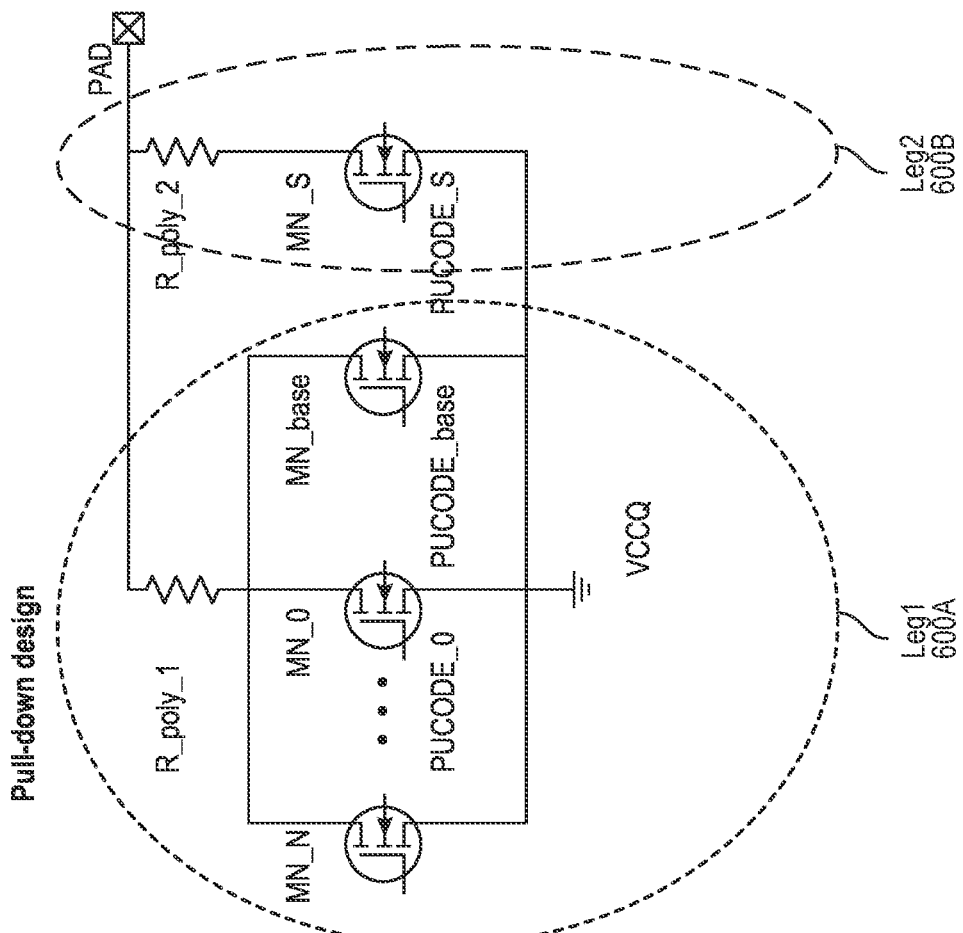
FIG. 13 shows a hybrid driver pull-down circuit according to an example embodiment of the disclosed technology.

FIG. 13 shows a hybrid driver pull-down circuit 600 according to an example embodiment of the disclosed technology. The hybrid driver pull-down circuit 600 may be implemented for example in a voltage mode driver that is part of or communicates with the storage controller 102 of FIG. 1; of course this is just an example and the disclosed technology is not limited to this application. The hybrid pull-down circuit 600 may send control signals or opcode to the storage controller 102 for communicating with the memory dies 104a-n. The memory dies 104a-n process incoming control signals from the storage controller 102.

The structure of the circuit 600 includes a first leg 600A, referred to herein as Leg1, and an added or second leg 600B, referred to herein as Leg2. Leg2 can be selectively enabled and disabled depending on whether it is needed as further explained below. In the circuit 600, the nMOS resistance contribution in the fast PVT case and that in the slow PVT case are separated using Leg2. In effect Leg2 is a slow calibration leg; as explained in detail below the disclosed technology performs a calibration to determine whether Leg2 is needed.

Leg1 includes a plurality (N+2) of electrical devices MN_base, MN_0, . . . , MN_N connected in parallel, which may be n-channel metal-oxide-semiconductor (MOS) field-effect transistors (FETs), also referred to as nMOS transistors. N depends on the specific circuit design. The nMOS transistors MN_base, MN_0, . . . , MN_N are connected to a common poly resistor R_poly_1. In this example design, NM_1 is double the size of NM_0, and NM_2 is double the size of NM_1, and so on. This means that NM_1 will have half the impedance of NM_0, NM_2 will have half the impedance of NM_1, and so on. If the circuit 600 is on, then MN_base will be on regardless of PVT, etc. (It is noted that while example embodiments of the present disclosure use one or more poly resistors, it is to be understood that any suitable resistor or resistance can be used in examples of the disclosed technology given throughout this application, including one or more resistors, or any other suitable circuit component or components that provide resistance, in series or parallel. This includes but is not limited to the example embodiments of FIGS. 13, 17, 18, 20, 21, 24, and 25.)

Leg2 includes an added nMOS transistor (MN_S) and an added poly resistor (R_poly_2). In slow corners the extra Leg2 can be turned on or enabled to achieve the desired pull-down (PD) impedance. By virtue of added Leg2, the overall poly resistor percentage in the fast case can be increased to achieve higher linearity without detrimentally affecting desired segment impedance in the slow corner, as in slow corners the added Leg2 can be enabled to attain the desired PD impedance.

The determination of whether and when to enable Leg2 can be decided during the ZQ calibration process as explained below in connection with the flowchart of FIG. 14. As a brief overall summary, the first clock cycle can be used to decide whether Leg2 must be enabled or not. To determine this, Leg2 is disabled and all of the nMOS devices in Leg1 turned on. In this condition if PD impedance of just Leg1 with all nMOS devices turned on is less than a desired PD impedance (240Ω in this example), then Leg2 is not needed and thus Leg2 is not enabled; otherwise Leg2 is enabled. Once this is decided, the ZQ calibration can proceed as in a normal case. It is noted that desired PD impedance can change based on the circuit designed needed. In this example PD impedance is 240Ω.

Figure 14:
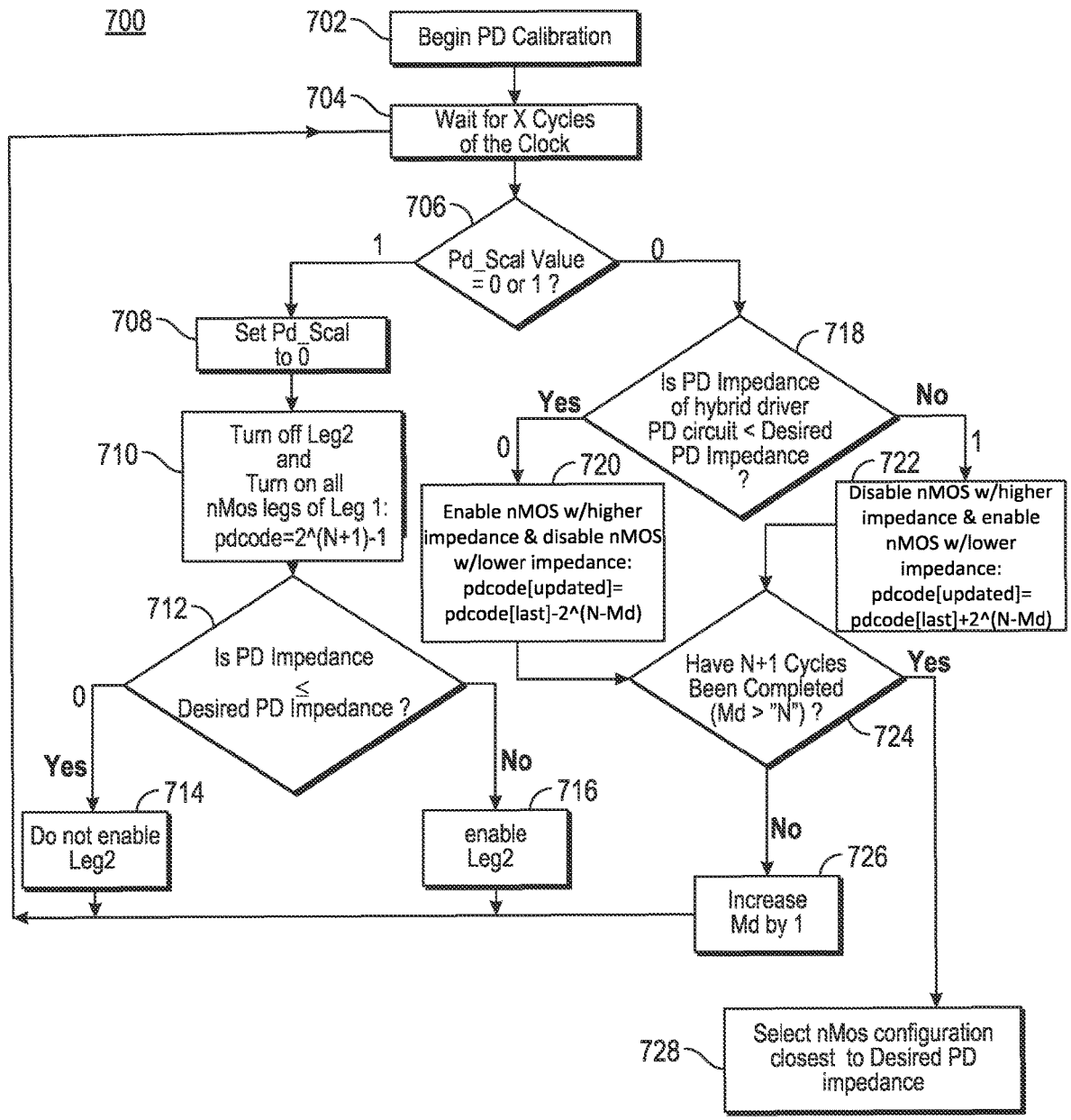
FIG. 14 is a flowchart illustrating a partial ZQ method to calibrate driver PD impedance according to an example embodiment of the disclosed technology.

FIG. 14 is a flowchart illustrating a partial ZQ process or method 700 that can be performed by a storage controller (e.g., the storage controller 102 of FIG. 1 or an external controller) and/or memory dies (e.g., memory die 104a of FIG. 1) to calibrate driver PD impedance according to the examples of the disclosed technology (of course this is just an example and the disclosed technology is not limited to this application). For example, the storage controller can fetch, decode, and/or execute one or more instructions for performing various steps of the method 700. Various instructions (e.g., for performing one or more steps described herein) can be stored in non-transitory storage medium of storage controller and/or control circuit of memory dies (e.g., control circuit 214 of FIG. 2A), where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD- ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of the storage controller may be encoded with executable instructions, for example, instructions for executing steps of the method 700. Non-transitory media is distinct from but may be used in conjunction with transmission media. Transmission media participates in transferring information between non-transitory media. For example, transmission media includes coaxial cables, copper wire and fiber optics, including the wires that comprise bus between the storage controller and a host. Transmission media can also take the form of acoustic or light waves, such as those generated during radio-wave and infra-red data communications.

As a brief overview the flowchart of FIG. 14 illustrates how Leg2 can be calibrated in a hybrid PD structure such as the hybrid PD structure shown in the circuit 600 of FIG. 13. According to example embodiments the disclosed technology implements an extra cycle during the ZQ calibration process (in the example embodiment of FIG. 13 these are Steps 708-716) to decide whether or not to turn Leg2 on. As noted above, in this example desired input impedance is set at 240Ω but of course the disclosed technology is not limited to this example.

Figure 16:
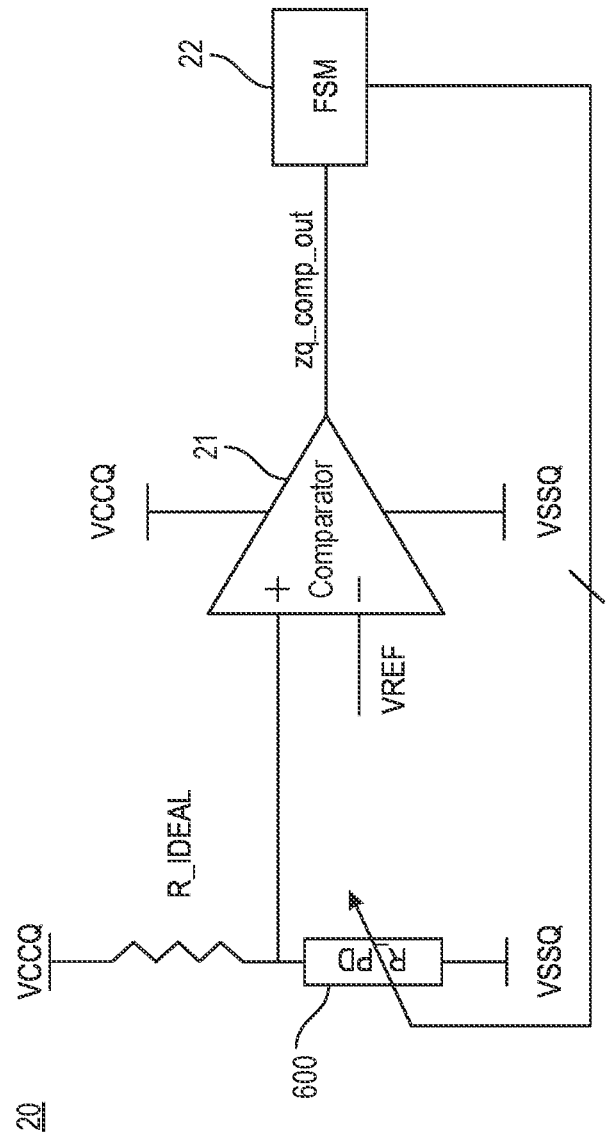
FIG. 16 illustrates a pull-down calibration using a comparator circuit.

In Step 702 the pull-down (PD) calibration begins. The PD calibration is processed in Steps 708-716 and is for the purpose of determining if Leg2 is needed and thus if Leg2 is to be enabled. In Step 704 the process waits for X cycles of the clock (clock_in). This is to let the loop settle which includes circuit 600, comparator 21, and finite state machine (FSM) 22 as shown in FIG. 16; particularly the first time through the process, waiting for some cycles can allow for more accurate data to be obtained.

In Step 706 the value of the variable pd_scal is obtained. This variable is the given name for the Leg2 calibration of the circuit 600 shown in FIG. 13; Leg2 is the "slow calibration" leg. The outcome of Step 706 determines whether to initiate the process of deciding whether Leg2 is needed and thus is to be enabled. It is noted that the value of pd_scal will always be either 0 or 1, and will always initially be 1 the first time through the ZQ calibration method 700.

If it is determined in Step 706 that the value of pd_scal is 1 then the method 700 proceeds to Step 708. In Step 708 pd_scal is set to 0. This is so that the next time through the process, after determining whether Leg2 is to be enabled or not, the ZQ calibration method will return to Step 704 and then will thereafter proceed down the right hand side of the flowchart 700 (i.e., proceeding to Step 718) to continue with ZQ calibration. For a given number of cycles N+2, the calibration steps on the left hand side of the flowchart 700 (e.g., Steps 708-716) need only be performed once, the first time through the N+2 cycles, to determine whether Leg2 is to be enabled. N is set by the circuit structure; for example in the circuit 600 of FIG. 13, there are N+2 devices in Leg1 600A (i.e., MN_base, MN_0, . . . , MN_N).

In Step 710 Leg2 is turned off, and all nMOS devices of Leg1 are turned on, in order to determine the maximum strength of Leg1. This step can be implemented as pdcode=2^(N+1)−1, which is a digital code to convert binary into decimal for MN_0 to MN_N devices.

Step 712 it is determined whether the PD impedance of Leg1 (with all nMOS devices of Leg1 turned on) and with Leg2 disabled) is less than or equal to the desired PD impedance required by the circuit design. In this example the desired PD impedance is 240Ω. Accordingly Step 712 is a calibration step that can be implemented by a calibration circuit having a comparator. If the PD impedance of Leg1 and Leg2 combined is less than or equal to the desired PD impedance (which here is 240Ω) then the comparator output is 0; if the PD impedance of Leg1 is greater than the desired PD impedance (here again 240Ω) then the comparator output is 1.

FIG. 16 shows one example of a calibration circuit 20 that can be used in Step 712. FIG. 16 illustrates a pull-down calibration using a comparator. Of course other suitable calibration circuits may be used. The hybrid driver pull-down circuit 600 of FIG. 13 is designated by R_PD in FIG. 16, with the arrow signifying the changing impedance of the circuit 600 from turning various nMOS devices on or off. The comparator 21 of FIG. 16 provides outputs as a 0 or 1 depending on whether the PD impedance is less than or greater than the desired PD impedance (e.g., 240Ω in this example). The finite state machine (FSM) 22 drives the circuit 600, i.e., turns nMOS devices on or off based on the output of the comparator 21. (An output of 1 from the comparator 21 means that the impedance of the circuit 600 is high and thus will be decreased.)

Returning to FIG. 14, if the comparator output from Step 712 is 0, signifying that the PD impedance of Leg1 at maximum strength combined with any impedance Leg2 is giving (if any) is less than or equal to the desired PD impedance, then in Step 714 it is determined that Leg2 is not needed (pdcode_s=0) and thus Leg2 is not enabled. If on the other hand the comparator output from Step 712 is 1, signifying that the PD impedance of Leg1 at maximum strength combined with any impedance Leg2 is giving (if any) is greater than the desired PD impedance, then in Step 716 it is determined that Leg2 is indeed needed (pdcode_s=1) and thus Leg2 is enabled.

Regardless of whether or not Leg2 is enabled, the process returns to Step 704. Now in all subsequent returns to Step 704 within the N+1 cycles, the PD calibration process comprising Steps 708-716 (i.e., the process to determine whether Leg2 is to be enabled or not) is not needed. Instead, the ZQ calibration proceeds based on the configuration of the hybrid driver pull-down circuit of FIG. 13 that results from Steps 708-716.

More specifically, as explained above, in all subsequent passes through Step 706 the pd_scal value will be 0 and thus the rest of the ZQ calibration will proceed from Step 706 to Step 718. The purpose of the rest of the ZQ calibration is to try to make the PD impedance as close as possible to the desired PD impedance chosen according to the specific circuit design (240Ω in this example). As a brief overall summary, and as further explained below, this is done by proceeding through N+1 cycles, turning off and on various nMOS transistors of the hybrid driver pull-down circuit of FIG. 13 as implemented in Steps 708-716, until the nMOS configuration closest to the desired PD impedance can be identified. In each cycle a different set of nMOS transistors of Leg1 are turned on and off and the resulting PD impedance is measured for that cycle. In this way a configuration of nMOS transistors in Leg1 can be selected that is closest to the desired PD impedance. Essentially this determines how many nMOS transistors of the hybrid driver PD circuit 600 to turn on—and which transistors they are.

Returning now to a more detailed discussion of the ZQ calibration process of FIG. 14, because pd_scal will be set to 0 for all passes through Step 706 after the first pass, the method proceeds to Step 718. In Step 718 it is determined whether the PD impedance of the hybrid driver PD circuit 600 of FIG. 13 is less than the desired PD impedance (240Ω in this example). Accordingly Step 718 is a calibration step that can be implemented by a calibration circuit (e.g., using the calibration circuit 20 of FIG. 16 or another suitable calibration circuit). If the PD impedance of the hybrid driver PD circuit 600 is less than the desired PD impedance (240Ω in this example) then the comparator output is 0, and if the PD impedance of the hybrid driver PD circuit 600 is greater than the desired PD impedance (240Ω in this example) then the comparator output is 1. (It is noted that the PD impedance being exactly 240Ω is very unlikely but in any case if the PD impedance were to exactly equal 240Ω then in practice the method would go to either 0 or 1 from Step 718 due to noise; either outcome would be within the margin of error. Regardless the method always continues and completes N+1 cycles as per Step 724.)

If in Step 718 the PD impedance of the hybrid driver PD circuit 600 of FIG. 13 is less than the desired PD impedance (240Ω in this example) then the outcome of Step 718 is 0 and the method proceeds to Step 720. In Step 720 an nMOS device that has higher impedance is enabled and an nMOS device that has lower impedance is disabled from the hybrid driver PD circuit 600 to increase the PD impedance. This can be done by trying a new configuration of the nMOS transistors in the hybrid driver PD circuit 600. Accordingly the calibration code in Step 720 is: pdcode [updated]=pdcode [last]−2^(N−Md). Initial values of pdcode=2^N. Md is an integer variable that starts with 1 and increases by 1 with each trip through Steps 718-726 of the method of FIG. 14.

On the other hand, if in Step 718 the PD impedance of the hybrid driver PD circuit 600 of FIG. 13 is greater than the desired PD impedance (240Ω in this example) then the outcome of Step 718 is 1 and the method proceeds to Step 722. In Step 722 an nMOS device that has higher impedance is disabled and an nMOS device that has lower impedance is enabled in the hybrid driver PD circuit to decrease the PD impedance. This can be done by trying a new configuration of the nMOS transistors in the hybrid driver PD circuit 600. Accordingly the calibration code in Step 720 is: pdcode [updated]=pdcode [last]+2^(N−Md). Initial values of pdcode=2^N. (An example of a PD calibration sequence for circuit 600A as described in Steps 718-722 is discussed below in connection with FIG. 22.)

In Step 724 it is queried whether N+1 cycles have been completed, i.e., whether Md>N. If NO then in Step 726 Md is increased by 1, i.e., Md++. If YES then in Step 728 the nMOS configuration closest to the desired PD impedance is selected and a code identifying that configuration is sent to the memory dies 104a-n by the storage controller 102.

As noted above, FIG. 22 illustrates an example of a PD calibration sequence for circuit 600A as described in Steps 718-722 in accordance with an example embodiment. In the pull-up design of FIG. 13, let us take the example that N=3. This means that for Leg1 600A there are five nMOS devices: MN_base, MN_0, MN_1, MN_2, and MN_3. PDCODE_base is the base nMOS; its size is determined during design based on PVT. MN_0 is the Least Significant Bit (LSB) transistor and MN_3 is the Most Significant Bit (MSB) transistor. Since the design is binary based, MN_1 is double the size of MN_0, MN_2 is double the size of MN_1, and MN_3 is double the size of MN_2. This means that the impedance of MN_0 is half that of MN_1, the impedance of MN_1 is half that of MN_2, and the impedance of MN_2 is half that of MN_3. If the weights of these nMOS devices are given based on size and if the weight of MN_0 is considered to be 1 then the respective weights of MN_1, MN_2, and MN_3 are 2, 4, and 8. When these nMOS devices are ON they provide finite impedance, and when these nMOS devices are OFF they provide infinite impedance and the current through them is 0 (ignoring leakage current). Whether the nMOS devices are ON or OFF is based on their respective gate inputs (PDCODE_S, PDCODE_base, PDCODE_0, . . . ). If the input is 0 this means that the nMOS is off and thus gives infinite impedance. For ease of understanding it is better to convert the strength of nMOS into numbers; this can be denoted by pdcode. Since PDCODE_base is the base leg and thus is not required to be calibrated, PDCODE_base is not considered in pdcode and only MN_0 to MN_N (here MN_3) are considered, as those are programmable. For pdcode calculation, an OFF device contribution is 0 and an ON device contribution is based on its strength. For example, MN_3 and MN_1 would add 8 and 2 respectively. In the case in which MN_3, MN_1, and MN_0 are ON and MN_2 is off then the pdcode would be 8+2+1=11.

Figure 22:
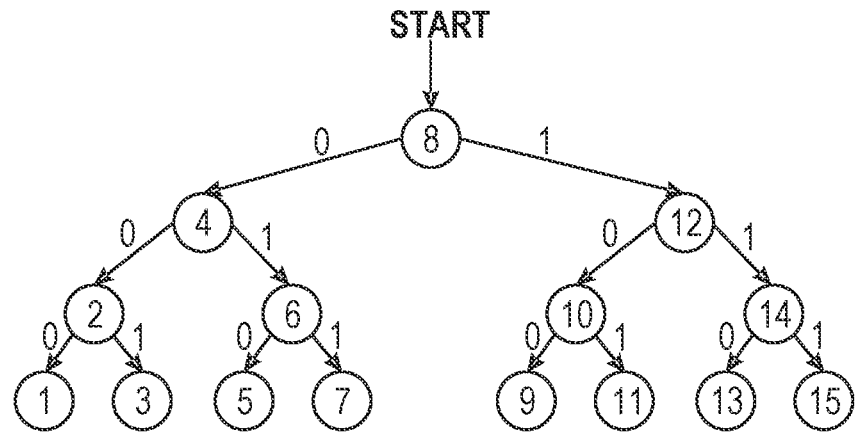
FIG. 22 illustrates an example of a PD calibration sequence in accordance with an example embodiment of the disclosed technology.

The calibration sequence of Leg1 600A is shown in FIG. 22 for the example of N=3. The calibration circuit for pull-down is shown in FIG. 16. For binary based design, calibration can be started from mid code (pdcode=8), which means that MN_3 is ON and MN_2, MN_1, and MN_0 are OFF. Also, MN_base has to be on as it is the base leg. Once pdcode 8 is driven to the pull-down, after a settling time of the comparator 21, the output of comparator 21 (i.e., zq_comp_out) is sensed by the FSM 22. If the outcome is 0 this means that the pull-down impedance is less and therefore that pdcode needs to be reduced; thus in the next cycle the FSM 22 switches OFF MN_3 and switches ON MN_2 which means that it makes pdcode=4. In the case that the output of comparator 21 output was 1, the pull-down impedance would have been higher and pdcode would have been required to be increased. In that case, FSM 22 would have kept MN_3 ON and switched MN_2 ON. Therefore based on the output of the comparator 21, FSM 22 would have either kept MN_3 ON or made MN_3 OFF and MN_2 would have been switched ON. In the next cycle, a similar occurrence would repeat but in place of MN_3 and MN_2, the change would happen for MN_2 and MN_1 respectively. This can be understood from FIG. 22 and also from Table 5:

TABLE 5

|  | MN_3 | MN_2 | MN_1 | MN_0 | MN_base |
|---|---|---|---|---|---|
| Initial | 1 | 0 | 0 | 0 | 1 |
| 1st cycle | 1/0 | 1 | 0 | 0 | 1 |
| 2nd cycle | No change | 1/0 | 1 | 0 | 1 |
| 3rd cycle | No change | No change | 1/0 | 1 | 1 |
| 4th cycle | No change | No change | No change | 1/0 | 1 |

In the above Table 5, 0 represents the OFF state and 1 represents the ON state. Based on the above, it takes N+1 cycles to calibrate Leg1 600A and N+2 cycles to calibrate circuit 600 (the combination of 600A and 600B), as 600B takes only 1 cycle.

Disclosed Technology v. Conventional Design Results Comparison

Table 4 in FIG. 15 shows an example design-results comparison of the linearity, step size, and pad-cap at the schematic level between the conventional driver design as shown in FIG. 9, a binary-based PD design with a common resistor and having different nMOS sizes, and a design for DDR4 pull-down according to an example embodiment of the disclosed technology. For the conventional design, it is noted that size 1×, 2×, 4× and 6× are rough estimates and not exact as the base leg size was changed to obtain the desired impedance in the fastest case. As shown in Table 4, step size (quantization error) is higher in all of the cases, and either pad-cap or linearity is poor with the conventional design. However, in the design according to an example of the disclosed technology there can be improvement in all of these parameters and the required specifications can be met by adding only one extra resistor (R_poly2) of 25% the size of the original resistor. Other examples are based on circuit design, e.g., 20%, etc. With the disclosed design MOS size is under control. Since the MOS size is lower in the disclosed design, driver and pre-driver size can be less with better performance.

From Table 4, it is evident that driver linearity can improve significantly with the design of the disclosed technology, and therefore based on data from Table 1, the effectiveness of ODT can be improved thereby resulting in better signal quality at the receiver end. Accordingly an advantage of the disclosed technology is that products designed with the disclosed technology can be more power and performance efficient.

Figure 17:
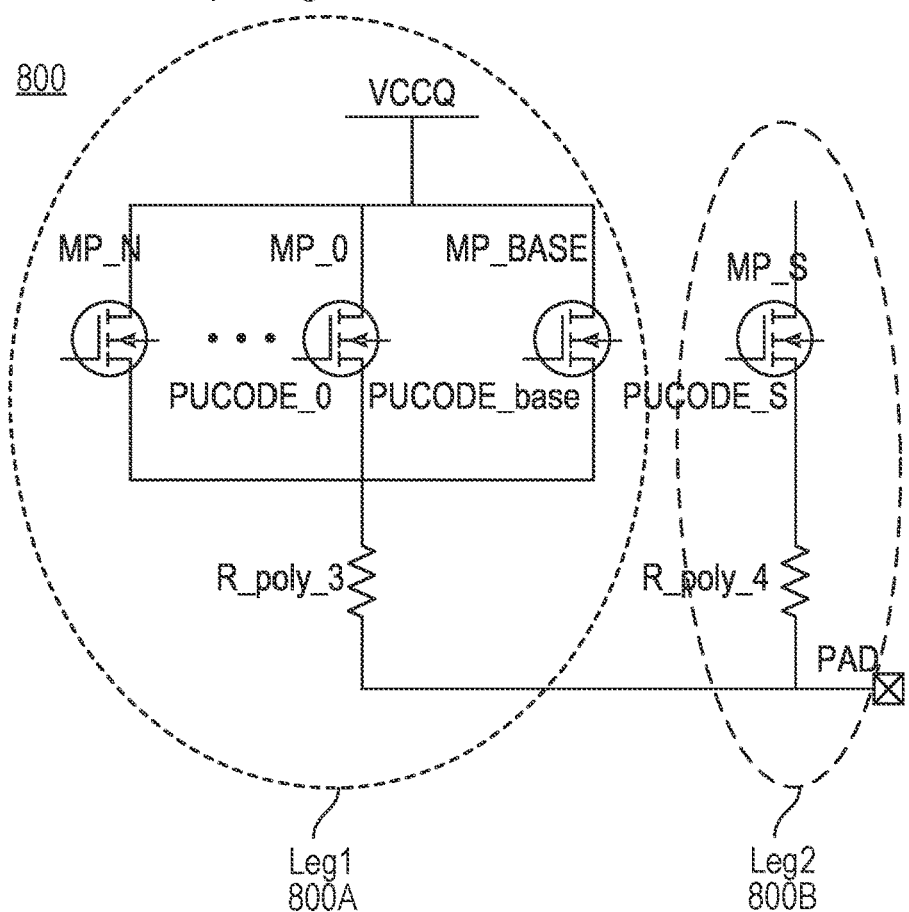
FIG. 17 shows a hybrid driver pull-up circuit according to an example embodiment of the disclosed technology.

FIG. 17 shows a hybrid driver pull-up circuit 800 according to an example embodiment of the disclosed technology. The hybrid driver pull-up circuit 800 may be implemented for example in a voltage mode driver that is part of or communicates with the storage controller 102 of FIG. 1; of course this is just an example and the disclosed technology is not limited to this application. The hybrid pull-up circuit 800 may send control signals or opcode to the storage controller 102 for communicating with the memory dies 104a-n. The memory dies 104a-n process incoming control signals from the storage controller 102.

The structure of the circuit 800 includes a first leg 800A, referred to herein as Leg1, and an added or second leg 800B, referred to herein as Leg2. Leg2 can be selectively enabled and disabled depending on whether it is needed as further explained below. In the circuit 800, the pMOS resistance contribution in the fast PVT case and that in the slow PVT case are separated using Leg2. In effect Leg2 is a slow calibration leg; as explained in detail below the disclosed technology performs a calibration to determine whether Leg2 is needed.

Leg1 includes a plurality (N+2) of electrical devices MP_base, MP_0, . . . , MP_N connected in parallel, which may be p-channel metal-oxide-semiconductor (MOS) field-effect transistors (FETs), also referred to as pMOS transistors. N depends on the specific circuit design. The pMOS transistors MP_base, MP_0, . . . , MP_N are connected to a common poly resistor R_poly_3. In this example design, MP_1 is double the size of MP_0, and MP_2 is double the size of MP_1, and so on. This means that MP_1 will have half the impedance of MP_0, MP_2 will have half the impedance of MP_1, and so on. If the circuit 800 is on, then MP_base will be on regardless of PVT, etc.

Leg2 includes an added pMOS transistor (MP_S) and an added poly resistor (R_poly_4). In slow corners the extra Leg2 can be turned on or enabled to achieve the desired pull-up (PU) impedance. By virtue of added Leg2, the overall poly resistor percentage in the fast case can be increased to achieve higher linearity without detrimentally affecting desired segment impedance in the slow corner, as in slow corners the added Leg2 can be enabled to attain the desired PU impedance.

The determination of whether and when to enable Leg2 can be decided during the ZQ calibration process as explained below in connection with the flowchart of FIG. 19. As a brief overall summary, the first cycle can be used to decide whether Leg2 must be enabled or not. To determine this, Leg2 is disabled and all of the pMOS devices in Leg1 turned on. In this condition if the PU impedance of just Leg1 with all pMOS devices turned on is less than a desired PU impedance (240Ω in this example), then Leg2 is not needed and thus Leg2 is disabled; otherwise Leg2 is enabled. Once this is decided, the ZQ calibration can proceed as in a normal case. It is noted that desired PU impedance can change based on the circuit designed needed. In this example PU impedance is 240Ω.

Figure 19:
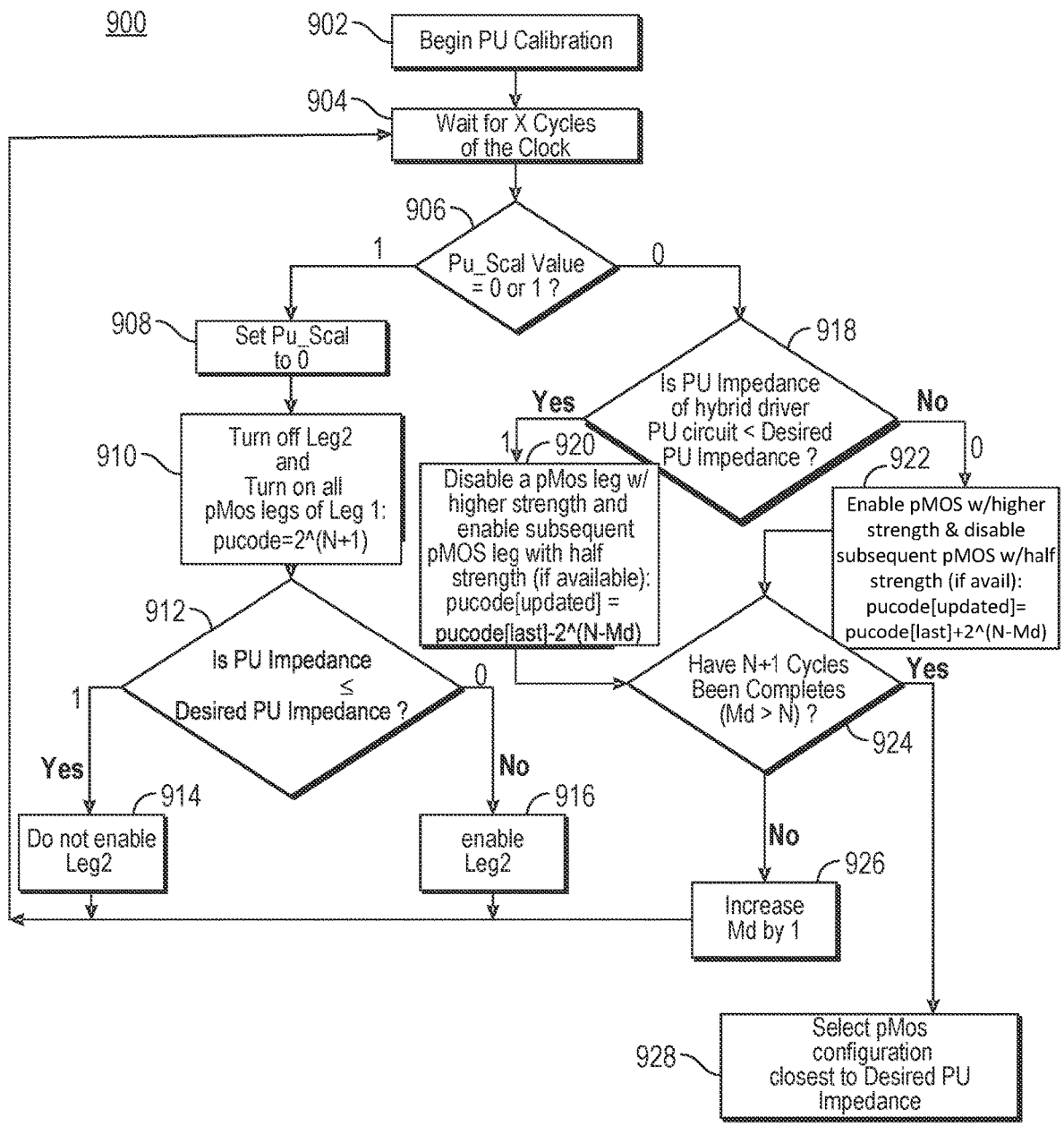
FIG. 19 is a flowchart illustrating a partial ZQ process to calibrate driver PD impedance according to the examples of the disclosed technology.

FIG. 19 is a flowchart illustrating a partial ZQ process or method 900 that can be performed by a storage controller (e.g., the storage controller 102 of FIG. 1 or an external controller) and/or memory dies (e.g., memory die 104a of FIG. 1) to calibrate driver PD impedance according to the examples of the disclosed technology; of course this is just an example and the disclosed technology is not limited to this application. For example, the storage controller can fetch, decode, and/or execute one or more instructions for performing various steps of the method 900. Various instructions (e.g., for performing one or more steps described herein) can be stored in non-transitory storage medium of storage controller and/or control circuit of memory dies (e.g., control circuit 214 of FIG. 2A), where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of the storage controller may be encoded with executable instructions, for example, instructions for executing steps of the method 900. Non-transitory media is distinct from but may be used in conjunction with transmission media. Transmission media participates in transferring information between non-transitory media. For example, transmission media includes coaxial cables, copper wire and fiber optics, including the wires that comprise bus between the storage controller and a host. Transmission media can also take the form of acoustic or light waves, such as those generated during radio-wave and infra-red data communications.

As a brief overview the flowchart of FIG. 19 illustrates how Leg2 can be calibrated in a hybrid PU structure such as the hybrid PU structure shown in the circuit 800 of FIG. 17. According to example embodiments the disclosed technology implements an extra cycle during the ZQ calibration process (in the example embodiment of FIG. 19 these are Steps 908-916) to decide whether or not to turn Leg2 on. As noted above, in this example desired input impedance is set at 240Ω but of course the disclosed technology is not limited to this example.

Figure 18:
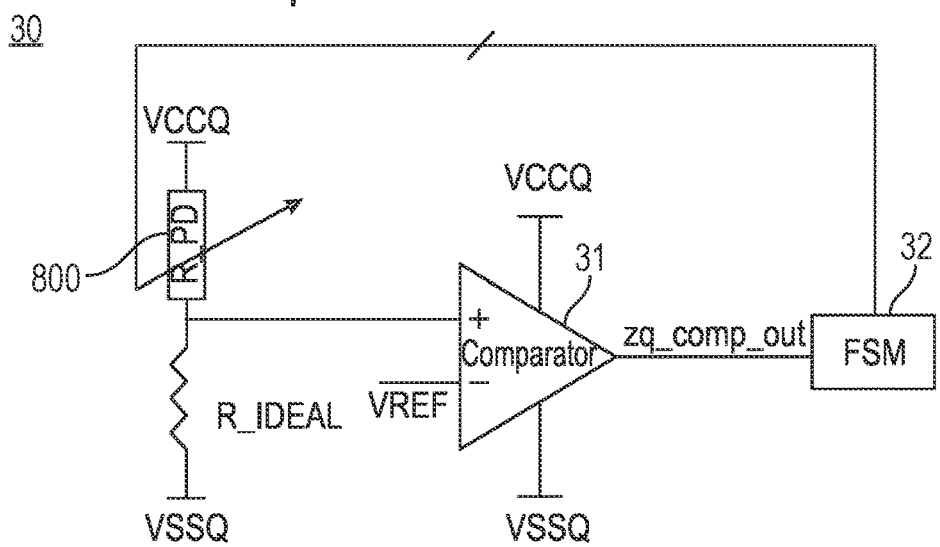
FIG. 18 illustrates a pull-up calibration using a comparator circuit.

In Step 902 the pull-up (PU) calibration begins. The PU calibration is processed in Steps 908-916 and is for the purpose of determining if Leg2 is needed and thus if Leg2 is to be enabled. In Step 904 the process waits for X cycles of the clock (clock_in). This is to let the loop settle which includes circuit 800, comparator 31, and FSM 32 as shown in FIG. 18; particularly the first time through the process, waiting for some cycles can allow for more accurate data to be obtained.

In Step 906 the value of the variable pu_scal is obtained. This variable is the given name for the Leg2 calibration of the circuit 800 shown in FIG. 17; Leg2 is the "slow calibration" leg. The outcome of Step 906 determines whether to initiate the process of deciding whether Leg2 is needed and thus is to be enabled. It is noted that the value of pu_scal will always be either 0 or 1, and will always initially be 1 the first time through the ZQ calibration method 900.

If it is determined in Step 906 that the value of pu_scal is 1 then the method 900 proceeds to Step 908. In Step 908 pu_scal is set to 0. This is so that the next time through the process, after determining whether Leg2 is to be enabled or not, the ZQ calibration method will return to Step 904 and then will thereafter proceed down the right hand side of the flowchart 900 (i.e., proceeding to Step 918) to continue with ZQ calibration. For a given number of cycles N+2, the calibration steps on the left hand side of the flowchart 900 (e.g., Steps 908-916) need only be performed once, the first time through the N+2 cycles, to determine whether Leg2 is to be enabled. N is set by the circuit structure; for example in the circuit 800 of FIG. 17, there are N+2 devices in Leg1 800A (i.e., MP_base, MP_0, . . . , MP_N).

In Step 910 Leg2 is turned off, and all pMOS devices of Leg1 are turned on, in order to determine the maximum strength of Leg1. This step can be implemented as pucode=2^(N+1), which is a digital code to convert binary into decimal.

In Step 912 it is determined whether the PU impedance of Leg1 (with all pMOS devices of Leg1 turned on and with Leg2 disabled) is less than or equal to the desired PU impedance required by the circuit design. In this example the desired PU impedance is 240Ω. Accordingly Step 912 is a calibration step that can be implemented by a calibration circuit (such as in calibration circuit 30 of FIG. 18). If the PU impedance of Leg1 and Leg2 combined is less than or equal to the desired PU impedance (which is 240Ω in this example) then the comparator output is 1; if the PU impedance of Leg1 is greater than the desired PU impedance (here again 240Ω) then the comparator output (zq_comp_out) is 0.

FIG. 18 shows one example of a calibration circuit 30 that can be used in Step 912. FIG. 18 illustrates a pull-up calibration using a comparator. Of course other suitable comparator circuits may be used. The hybrid driver pull-up circuit 800 of FIG. 17 is designated by R_PU in FIG. 18, with the arrow signifying the changing impedance of the circuit 800 from turning various pMOS devices on or off. The comparator 31 of FIG. 16 uses a calibration algorithm to output a 0 or 1 depending on whether the PU impedance is less than or greater than the desired PU impedance (e.g., 240Ω in this example). The finite state machine (FSM) 32 drives the circuit 800, i.e., turns pMOS devices on or off based on the output of the comparator 31. (An output of 1 from the comparator 31 means that the impedance of the circuit 800 is low and thus will be increased.)

Returning to FIG. 19, if the comparator output from Step 912 is 1, signifying that the PU impedance of Leg1 at maximum strength combined with any impedance Leg2 is giving (if any) is less than or equal to the desired PU impedance, then in Step 914 it is determined that Leg2 is not needed (pucode_s=1) and thus Leg2 is not enabled. (If pucode_s=1 this means that pucode_s is electrically VCCQ and therefore that MP_S is off.) If on the other hand the comparator output from Step 912 is 0, signifying that the PU impedance of Leg1 at maximum strength combined with any impedance Leg2 is giving (if any) is greater than the desired PU impedance, then in Step 916 it is determined that Leg2 is indeed needed (pucode_s=0) and thus Leg2 is enabled.

Regardless of whether or not Leg2 is enabled, the process returns to Step 904. Now in all subsequent returns to Step 904, the PU calibration process comprising Steps 908-916 (i.e., the process to determine whether Leg2 is to be enabled or not) is not needed. Instead, the ZQ calibration proceeds based on the configuration of the hybrid driver pull-up circuit of FIG. 17 as implemented in Steps 908-916.

More specifically, as explained above, in all subsequent passes through Step 906 the pu_scal value will be 0 and thus the rest of the ZQ calibration will proceed from Step 906 to Step 918. The purpose of the rest of the ZQ calibration is to try to make the PU impedance as close as possible to the desired PU impedance chosen according to the specific circuit design (240Ω in this example). As a brief overall summary, and as further explained below, this is done by proceeding through N+1 cycles, turning off and on various pMOS transistors of the hybrid driver pull-up circuit of FIG. 17 as implemented in Steps 908-916, until the pMOS configuration closest to the desired PU impedance can be identified. In each cycle a different set of pMOS transistors of Leg1, are turned on and off and the resulting PU impedance is measured for that cycle. In this way a configuration of pMOS transistors in Leg1 can be selected that is closest to the desired PU impedance. Essentially this determines how many pMOS transistors of the hybrid driver PU circuit 800 to turn on—and which transistors they are.

Returning now to a more detailed discussion of the ZQ calibration process of FIG. 19, because pu_scal will be set to 0 for all passes through Step 906 after the first pass, the method proceeds to Step 918. In Step 918 it is determined whether the PU impedance of the hybrid driver PU circuit 800 of FIG. 17 is less than the desired PU impedance (240Ω in this example). Accordingly Step 918 is a calibration step that can be implemented by a calibration circuit (e.g., using the calibration circuit 30 of FIG. 18 or another suitable calibration circuit). If the PU impedance of the hybrid driver PU circuit 800 is less than the desired PU impedance (240Ω in this example) then the comparator output is 1, and if the PU impedance of the hybrid driver PD circuit 800 is greater than the desired PU impedance (240Ω in this example) then the comparator output is 0. (It is noted that the PU impedance being exactly 240Ω is very unlikely but in any case if the PU impedance were to exactly equal 240Ω then in practice the method would go to either 0 or 1 from Step 918 due to noise; either outcome would be within the margin of error. Regardless the method always continues and completes 'N+1' cycles as per Step 924.)

If in Step 918 the PU impedance of the hybrid driver PU circuit 800 of FIG. 17 is less than the desired PU impedance (240Ω in this example) then the outcome of Step 918 is 1 and the method proceeds to Step 920. In Step 920, a pMOS device that has higher strength is disabled and a subsequent pMOS device that has half the strength is enabled. This can be done by trying a new configuration of the pMOS transistors in the hybrid driver PU circuit 800. Accordingly the calibration code in Step 920 is: pucode [updated]=pucode [last]−2^(N−Md). Initial values of pucode=2^N. Md is an integer variable that starts with 1 and increases by 1 with each trip through Steps 918-926 of the method of FIG. 19.

On the other hand, if in Step 918 the PU impedance of the hybrid driver PU circuit 800 of FIG. 17 is greater than the desired PU impedance (240Ω in this example) then the outcome of Step 918 is 0 and the method proceeds to Step

922. In Step 922 a pMOS device with higher strength is enabled in the hybrid driver PD circuit and a subsequent pMOS device with half strength is disabled (if available) to decrease the PU impedance. This can be done by trying a new configuration of the pMOS transistors in the hybrid driver PU circuit 800. Accordingly the calibration code in Step 920 is: pucode [updated]=pucode [last]+2^(N−Md). Initial values of pucode=2^N. (An example of a PU calibration sequence for circuit 800A as described in Steps 918-922 is discussed below in connection with FIG. 23.)

In Step 924 it is queried whether N+1 cycles have been completed, i.e., whether Md>N. If NO then in Step 926 Md is increased by 1, i.e., Md++. If YES then in Step 928 the pMOS configuration closest to the desired PU impedance is selected and a code identifying that configuration is sent to the memory dies 104a-n by the storage controller 102.

As noted above, FIG. 23 illustrates an example of a PU calibration sequence for circuit 800A as described in Steps 918-922 in accordance with an example embodiment. In the PU design of FIG. 17, let us again take the example that N=3. This means that for 800A there are five pMOS: MP_base, MP_0, MP_1, MP_2, and MP_3. PUCODE_base is the base pMOS; its size is determined during design based on PVT. MP_0 is the LSB transistor and MP_3 is the MSB transistor. Since the design is binary based, MP_1 is double the size of MP_0, MP_2 is double the size of MP_1, and MP_3 is double the size of MP_2. This means that the impedance of MP_0 is half compared to that of MP_1, the impedance of MP_1 is half compared to that of MP_2, and the impedance of MP_2 is half compared to that of MP_3. If the weights of these pMOS devices are given based on size and if the weight of MP_0 is considered to be 1, then the respective weights of MP_1, MP_2, and MP_3 are 2, 4, and 8. When these pMOS devices are ON they provide finite impedance and when these pMOS devices are off they provide infinite impedance and the current through them is 0 (ignoring leakage current). Whether the pMOS devices are ON or OFF is based on their gate inputs (PUCODE_S, PUCODE_base, PUCODE_0, . . . ). If the input is VCCQ this means that the pMOS device is OFF and thus it gives an infinite impedance. For ease it is better to convert the strength of a pMOS device into numbers; this can be denoted by pucode. Since PUCODE_base is the base leg and the base leg is not required to be calibrated, it is not considered in pdcode and only MP_0 to MP_N (here MP_3) are considered, as those are programmable. For pucode calculation, OFF device contribution is 0 and ON device contribution is based on its strength. For example MP_3 and MP_1 would add 8 and 2 respectively. In the case in which MP_3, MP_1, and MP_0 are ON and MP_2 is OFF the pucode would be 8+2+1=11.

Figure 23:
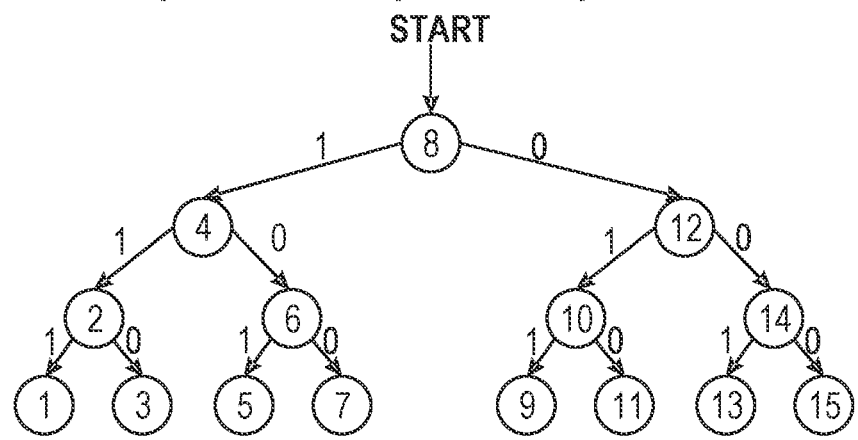
FIG. 23 illustrates an example of a PU calibration sequence in accordance with an example embodiment of the disclosed technology.

The calibration sequence of 800A is shown in FIG. 23 for the example N=3. The calibration circuit for pull-up is shown in FIG. 18. For binary based design, calibration can be started from mid code (pucode=8). This means that MP_3 is ON and MP_2, MP_1, and MP_0 are OFF. Also MP_base has to be ON as it is the base leg. Once pucode 8 is driven to the pull-up, after a settling time of the comparator 31, the output of the comparator 31 (i.e., zq_comp_out) is sensed by the FSM 32. If the output of the comparator 31 is 1 this means that the pull-up impedance is less and thus pucode needs to be reduced so in the next cycle the FSM 32 switches OFF MP_3 and switches ON MP_2 which means that it makes pucode=4. In the case that the comparator 31 output was 0, the pull-up impedance would have been higher and pucode would have been required to be increased. In that case the FSM 32 would have kept MP_3 ON and switched on MP_2. Therefore based on the output of the comparator 31, FSM 32 would have either kept MP_3 ON or made MP_3 OFF, and MP_2 would have been switched ON. In the next cycle a similar occurrence would repeat but in place of MP_3 and MP_2, the change would happen for MP_2 and MP_1 respectively. This can be understood from FIG. 22 and also from following Table 6:

TABLE 6

|  | MP_3 | MP_2 | MP_1 | MP_0 | MP_base |
|---|---|---|---|---|---|
| Initial | 1 | 0 | 0 | 0 | 1 |
| 1$^{st}$ cycle | 1/0 | 1 | 0 | 0 | 1 |
| 2$^{nd}$ cycle | No change | 1/0 | 1 | 0 | 1 |
| 3$^{rd}$ cycle | No change | No change | 1/0 | 1 | 1 |
| 4$^{th}$ cycle | No change | No change | No change | 1/0 | 1 |

In the above Table 6, 0 represents the OFF state and 1 represents the ON state. Based on the above, it takes N+1 cycles to calibrate 800A and N+2 cycles to calibrate 800 (the combination of 800A and 800B) as 800B only takes 1 cycle.

Scalability

Figure 20:
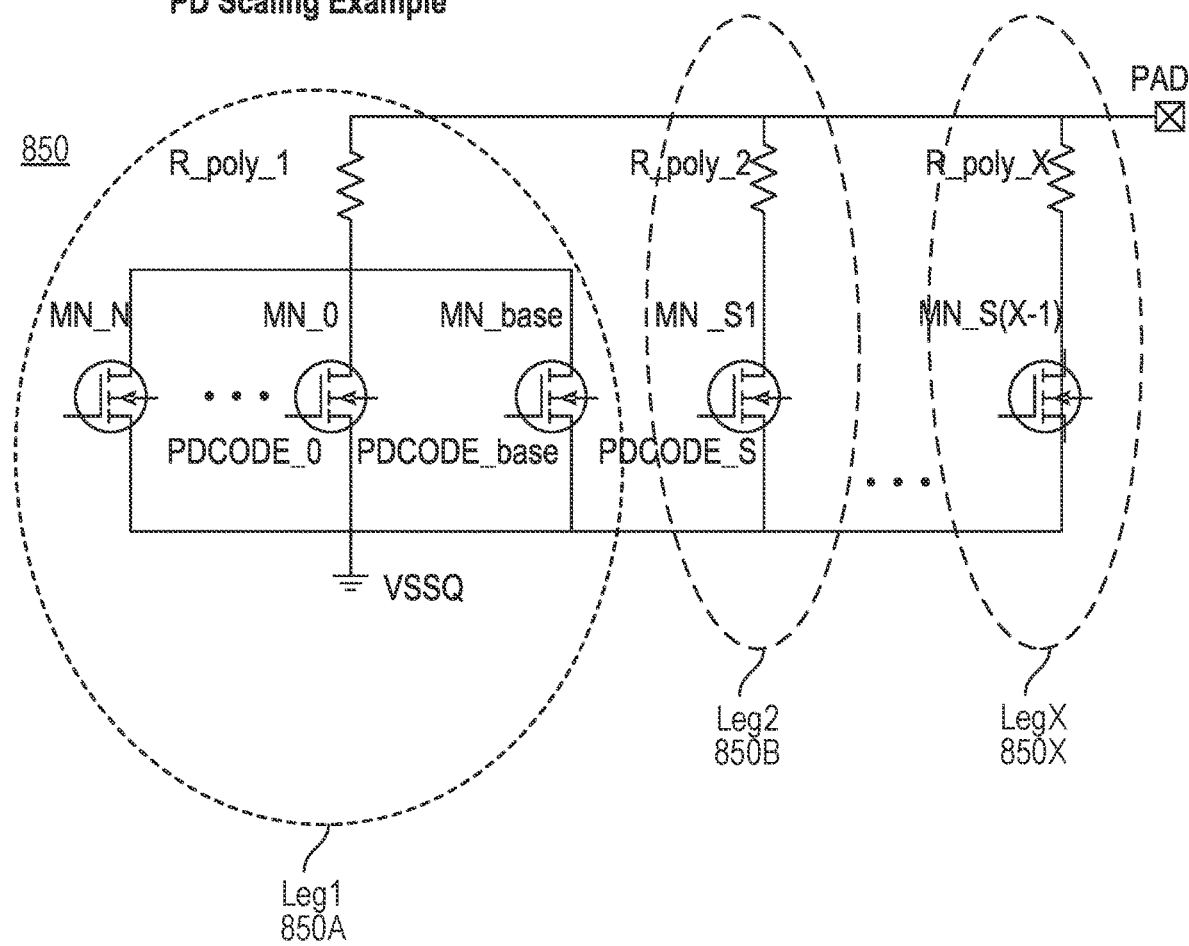
FIG. 20 shows an example of a scalable hybrid driver pull-down circuit according to an example embodiment of the disclosed technology.

As noted above, example embodiments can also have a scalable architecture through adding further resistor/nMOS or resistor/pMOS circuit legs according to the disclosed technology, in order to achieve better performance. FIG. 20 shows an example of a scalable hybrid driver pull-down circuit 850 according to an example embodiment of the disclosed technology. The scalable hybrid driver pull-down circuit 850 may be implemented for example in a voltage mode driver that is part of or communicates with the storage controller 102 of FIG. 1; of course this is just an example and the disclosed technology is not limited to this application. The scalable hybrid pull-down circuit 850 may send control signals or opcode to the storage controller 102 for communicating with the memory dies 104a-n. The memory dies 104a-n process incoming control signals from the storage controller 102.

The circuit 850 includes a first leg 850A, referred to herein as Leg1, and an added or second leg 850B, referred to herein as Leg2. The circuit structure can be scaled up to X legs, shown in FIG. 20 as LegX 850X. The structure and operation of Leg1 and Leg2 are similar to that of the hybrid driver pull-down circuit 600 shown in FIG. 13. Leg2 can be selectively enabled and disabled depending on whether it is needed as further explained below. In the circuit 850 of FIG. 20, the nMOS resistance contribution in the different PVT cases are separated using different legs, e.g., in the fastest case only Leg1 is sufficient and other legs would be required to be switched off. On the other hand, for the slowest case, all of the legs (Leg1, Leg2, . . . , LegX) would be required to be switched on; also for Leg1, how many devices to turn on would be determined by a ZQ calibration process.—The disclosed technology performs a ZQ calibration to determine how many legs are needed.

Leg1 includes a plurality (N+2) of electrical devices MN_base, MN_0, . . . , MN_N connected in parallel, which may be n-channel metal-oxide-semiconductor (MOS) field-effect transistors (FETs), also referred to as nMOS transistors. N depends on the specific circuit design. The nMOS transistors MN_base, MN_0, . . . , MN_N are connected to a common poly resistor R_poly_1.

Leg2 includes an added nMOS transistor (MN_S1) and an added poly resistor (R_poly_2). In slower corners the extra Leg2 can be turned on or enabled to achieve the desired pull-down (PD) impedance. By virtue of added Leg2, the overall poly resistor percentage in the faster case can be increased to achieve higher linearity without detrimentally affecting desired segment impedance in the slower corner, as in slower corners the added Leg2, Leg3, . . . LegX can be enabled based on a requirement to attain the desired PD impedance.

The determination of whether and when to enable Leg2 can be decided during the ZQ calibration process as described herein. The first cycle can be used to decide whether Leg2 must be enabled or not. To determine this, Leg2 and subsequent Legs (Leg3, Leg4, . . . , LegX) are disabled and all of the nMOS devices in Leg1 turned on. In this condition if PD impedance of just Leg1 with all nMOS devices turned on is less than a desired PD impedance (240Ω in this example), then Leg2 is not needed and thus Leg2 is not enabled; otherwise Leg2 is enabled.

If Leg2 is enabled then it is determined whether to enable the next Leg, i.e., Leg3 in this example. To determine this, Leg3 and subsequent legs (Leg4, . . . , LegX) are disabled and all of the nMOS devices in Leg1 plus Leg2 are turned on. In this condition if PD impedance of just Leg1 and Leg2 with all nMOS devices turned on is less than a desired PD impedance (240Ω in this example), then Leg3 is not needed and thus Leg3 is not enabled; otherwise, Leg3 is enabled and it can be determined similarly whether to enable the next leg, i.e., Leg4. Accordingly the architecture can be scaled as much as practicable given considerations such as additional area required by added legs.

It is noted that in FIG. 20 "Leg3" per se is not shown (nor is "Leg4") but "LegX" (850X) is shown, along with R_poly_X. X=3 in this example but X could be 3, 4, 5 . . . or greater. In this way the architecture is scalable as the process can continue for more values of the integer X. Once the PD impedance of Leg1 through Leg(Z−1) with all nMOS devices turned on is less than the desired PD impedance (240Ω in this example), then LegZ is not needed and thus LegZ is not enabled and the process stops. (It is noted that Z varies from 2 to X.)

We can determine how many legs are needed using either a linear-based method or a binary-based method; for quicker determination a binary-based method can be used. In any event a calibration algorithm can be used to determine in ceil (log(x))+1 cycles when the impedance of the first through the Z−1 circuits with the Zth circuit disabled is greater than the desired pulldown impedance. In ceil (log(x))+1, ceil means ceiling. Using a binary sequence we can determine within log(x)+1 cycles how many legs to be enabled.

Once it is decided whether LegX is needed or whether Leg1 through Leg(X−1) are sufficient, the ZQ calibration can proceed as in a normal case. It is noted that desired PD impedance can change based on the circuit designed needed. In this example PD impedance is 240Ω.

Figure 21:
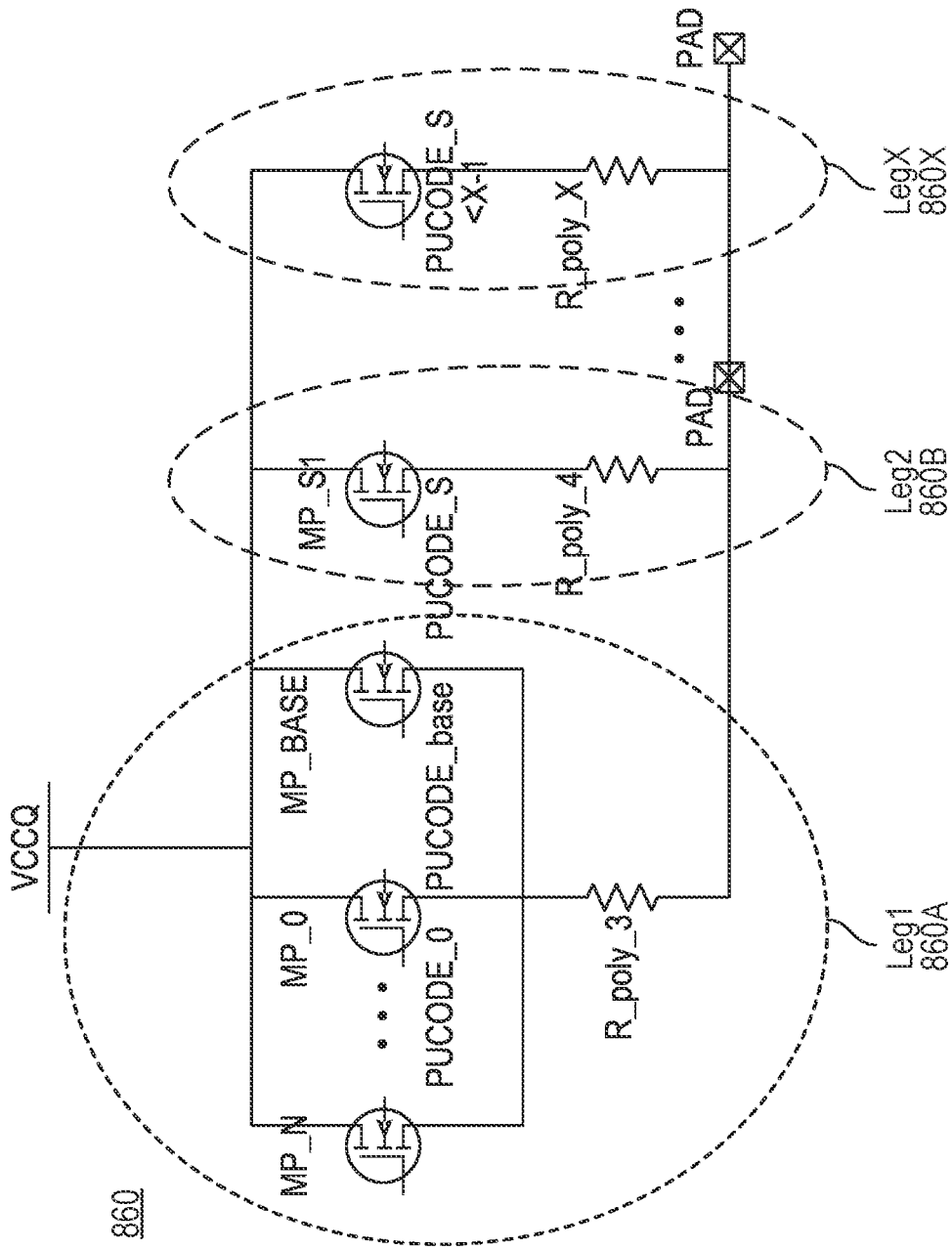
FIG. 21 shows an example of a scalable hybrid driver pull-up circuit according to an example embodiment of the disclosed technology.

FIG. 21 shows an example of a scalable hybrid driver pull-up circuit 860 according to an example embodiment of the disclosed technology. The scalable hybrid driver pull-up circuit 860 may be implemented for example in a voltage mode driver that is part of or communicates with the storage controller 102 of FIG. 1; of course this is just an example and the disclosed technology is not limited to this application. The scalable hybrid pull-up circuit 860 may send control signals or opcode to the storage controller 102 for communicating with the memory dies 104a-n. The memory dies 104a-n process incoming control signals from the storage controller 102.

The circuit 860 includes a first leg 860A, referred to herein as Leg1, and an added or second leg 860B, referred to herein as Leg2. The circuit structure can be scaled up to X legs, shown in FIG. 21 as LegX 860X. The structure and operation of Leg1 and Leg2 are similar to that of the hybrid driver pull-up circuit 800 shown in FIG. 17. Leg2 can be selectively enabled and disabled depending on whether it is needed as further explained below. In the circuit 860, the pMOS resistance contribution in different PVT cases are separated using different legs e.g. in the fastest case only Leg1 is sufficient and other legs would be required to be switched off. On the other hand, for the slowest case, all the legs (Leg1, Leg2, . . . , LegX) would be required to be switched on; also for Leg1, how many devices to turn on would be determined by a ZQ calibration process. The disclosed technology performs a ZQ calibration to determine how many legs are needed.

Leg1 includes a plurality (N+2) of electrical devices MP_base, MP_0, . . . , MP_N connected in parallel, which may be p-channel metal-oxide-semiconductor (MOS) field-effect transistors (FETs), also referred to as pMOS transistors. N depends on the specific circuit design. The pMOS transistors MP_base, MP_0, . . . , MP_N are connected to a common poly resistor R_poly_3.

Leg2 includes an added pMOS transistor (MP_S1) and an added poly resistor (R_poly_4). In slower corners the extra Leg2 can be turned on or enabled to achieve the desired pull-up (PU) impedance. By virtue of added Leg2, the overall poly resistor percentage in the faster case can be increased to achieve higher linearity without detrimentally affecting desired segment impedance in the slower corner, as in slower corners the added Leg2, Leg3, . . . LegX can be enabled based on a requirement to attain the desired PU impedance.

The determination of whether and when to enable Leg2 can be decided during the ZQ calibration process as described herein. The first cycle can be used to decide whether Leg2 must be enabled or not. To determine this, Leg2 and subsequent legs (Leg3, Leg4, . . . , LegX) are disabled and all of the pMOS devices in Leg1 turned on. In this condition if PU impedance of just Leg1 with all pMOS devices turned on is less than or equal to a desired PU impedance (240Ω in this example), then Leg2 is not needed and thus Leg2 is not enabled; otherwise Leg2 is enabled.

If Leg2 is enabled then it is determined whether to enable the next Leg, i.e., Leg3 in this example. To determine this, Leg3 and subsequent legs (Leg4, . . . , LegX) are disabled and all of the pMOS devices in Leg1 plus Leg2 are turned on. In this condition if PU impedance of just Leg1 and Leg2 with all pMOS devices turned on is less than or equal to a desired PU impedance (240Ω in this example), then Leg3 is not needed and thus Leg3 is not enabled; otherwise Leg3 is enabled. If Leg3 is enabled it can be determined in a similar manner whether to enable the next leg, i.e., Leg4. Accordingly the architecture can be scaled as much as practicable given considerations such as additional area required by added legs.

It is noted that in FIG. 21 "Leg3" per se is not shown (nor is "Leg4") but "LegX" (860X) is, along with R_poly_X. X=3 in this example but X could be 3, 4, 5 . . . or greater. In this way the architecture is scalable as the process can continue for more values of the integer X. Once the PU impedance of Leg1 through Leg(Z−1) with all pMOS devices turned on is less than or equal to the desired PU impedance (240Ω in this example), then LegZ is not needed and thus LegZ is not enabled and the process stops. (It is noted that Z varies from 2 to X.)

It can be determined how many legs are needed using either a linear-based method or a binary-based method; for quicker determination a binary-based method can be used. In any event a calibration algorithm can be used to determine in ceil (log(x))+1 cycles when the impedance of the first through the Z−1 circuits with the Zth circuit disabled is less than or equal to the desired pullup impedance. In ceil (log(x))+1, ceil means ceiling. Using a binary sequence we can determine within log(x)+1 cycles what Y is how many legs to be enabled.

Once it is decided whether LegZ is needed or Leg1 through Leg(Z−1) are sufficient, the ZQ calibration can proceed as in a normal case. It is noted that desired PU impedance can change based on the circuit designed needed. In this example PU impedance is 240Ω.

Figure 24:
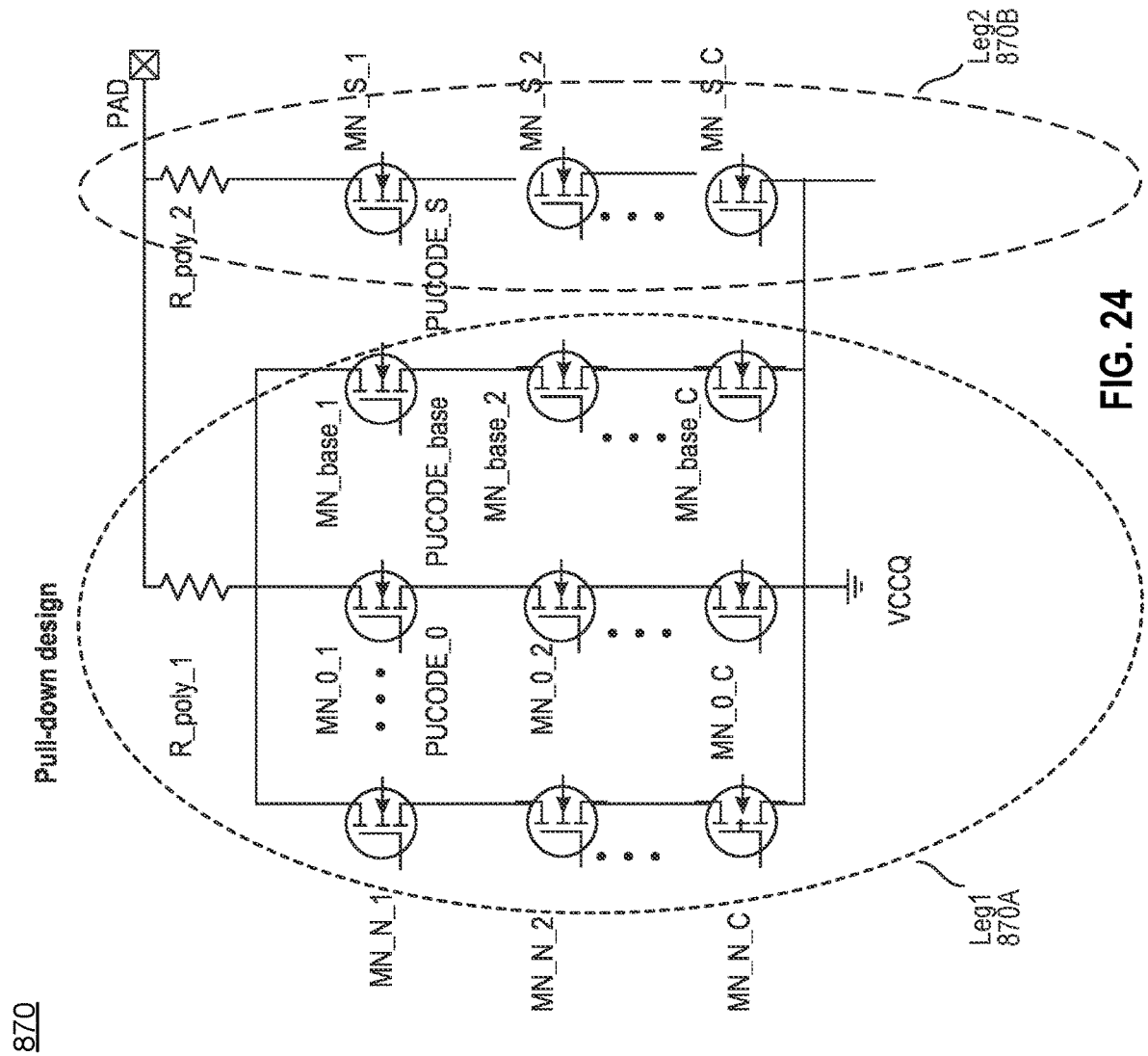
FIG. 24 illustrates a pull-down design of an example embodiment in which one or more nMOS devices are implemented as multiple stacked devices.
Figure 25:
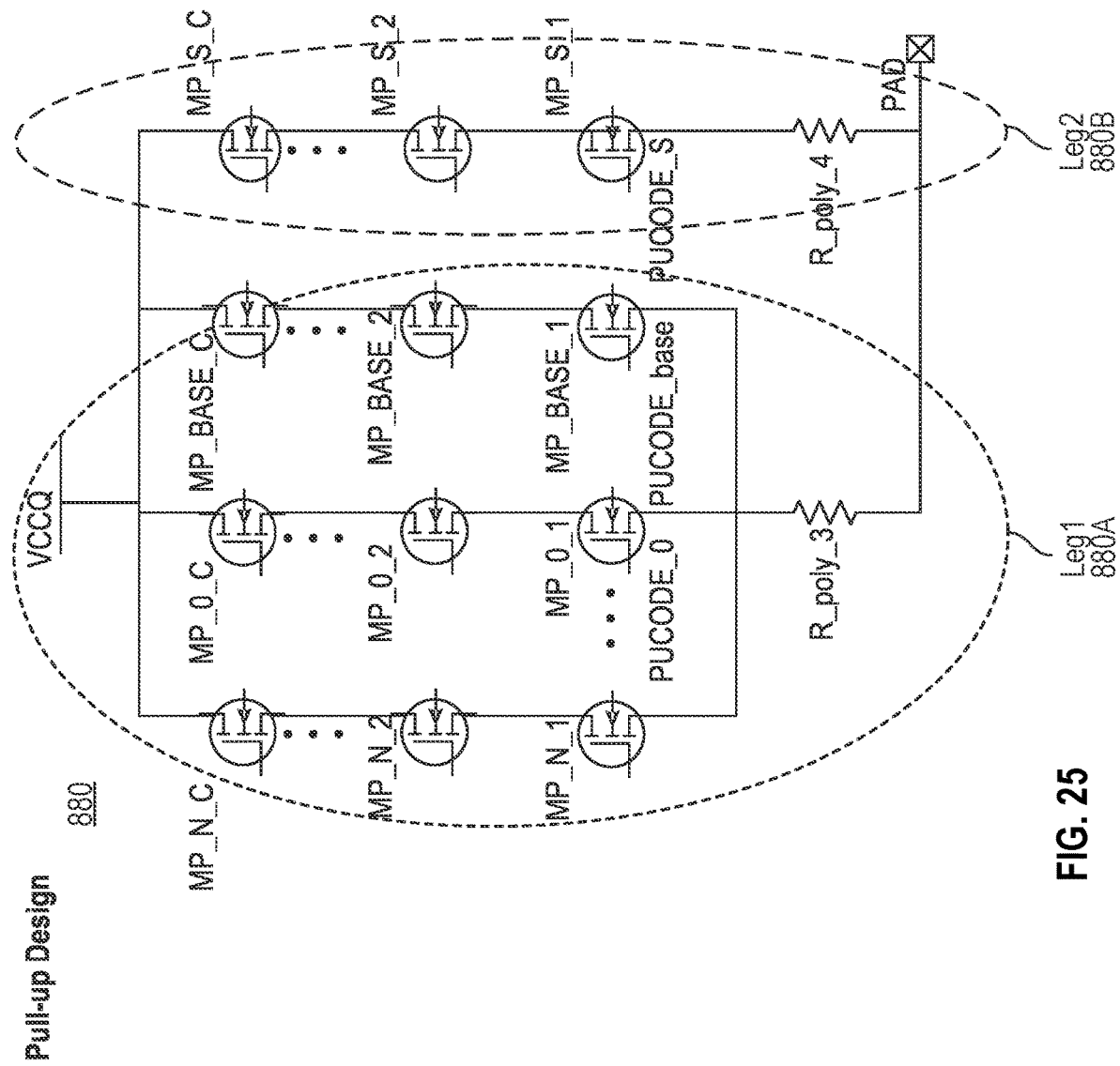
FIG. 25 illustrates a pull-up design of an example embodiment in which one or more pMOS devices are implemented as multiple stacked devices.

Modifications of the example embodiments provided herein are readily envisioned. As one non-limiting example, each nMOS or pMOS device in the example embodiments (including but not limited to the example embodiments of FIGS. 13, 17, 20, and 21) can be implemented as single devices or as stacked devices with the same or different inputs. Inputs could be, e.g., data, a calibration code, or a voltage reference. For example, FIG. 24 shows a pull-down design 870 of an example embodiment having Leg1 870A and Leg2 870B, in which one or more nMOS devices (e.g., MN_base, MN_S, MN_0, MN_1 of FIG. 13) could be implemented as single devices or as multiple stacked devices with different inputs (e.g., MN_N could be implemented as MN_N_1, MN_N_2, . . . , MN_N_C). FIG. 25 shows a pull-up design 880 of another example embodiment having Leg1 880A and Leg2 880B, in which one or more pMOS devices (e.g., MP_base, MP_S, MP_0, . . . , MP_N of FIG. 17) could be implemented as single devices or as multiple stacked devices with different inputs (e.g., MP_N could be implemented as MP_N_1, MP_N_2, . . . , MP_N_C).

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A voltage mode driver, comprising:
  a pull-down stage including:
    a first circuit having a plurality of nMOS devices in parallel, the plurality of nMOS devices being common to a first resistor;
    a second circuit in parallel with the first circuit and having an nMOS device in series with a second resistor; and
    X-2 additional circuits in parallel with the first and second circuits, each additional circuit having an additional nMOS device in series with an additional resistor,
    wherein the second circuit is configured to be enabled when a pulldown impedance of the first circuit, with the second circuit disabled and all of the nMOS devices of the first circuit turned on, is greater than a desired pulldown impedance, and
    wherein each of the first circuit through a Yth circuit are configured to be enabled when a condition is met that the pulldown impedance of the first through the (Y-1)th circuits, with the Yth circuit disabled and all of the nMOS devices of the first through the (Y-1)th circuits turned on, is greater than the desired pulldown impedance, and
    wherein X is an integer greater than 2, and Y is an integer greater than 1.

2. The voltage mode driver of claim 1, wherein a calibration algorithm is used to determine in one cycle whether the pulldown impedance of the first circuit, with the second circuit disabled and all of the nMOS devices of the first circuit turned on, is greater than the desired pulldown impedance or not.

3. The voltage mode driver of claim 1, wherein the voltage mode driver is implemented in a memory device.

4. The voltage mode driver of claim 1, wherein a calibration algorithm is used to determine in ceil (log (x)) cycles when the pulldown impedance of the first through the (Y-1) th circuits, with the Yth circuit disabled and all of the nMOS devices of the first through the (Y-1) th circuits turned on, is greater than the desired pulldown impedance, and wherein a binary sequence is used to determine within log (x) cycles the value of Y.

5. The voltage mode driver of claim 1, further comprising:
a pull-up stage including:
   a third circuit having a plurality of pMOS devices in parallel, the plurality of pMOS devices being common to a third resistor; and
   a fourth circuit in parallel with the third circuit and having a pMOS device in series with a fourth resistor,
   wherein the fourth circuit is configured to be enabled when a pull-up impedance of the third circuit, with the fourth circuit disabled and all of the pMOS devices of the third circuit turned on, is greater than a desired pull-up impedance.

6. The voltage mode driver of claim 5, wherein a calibration algorithm is used to determine in one cycle when the pull-up impedance of the third circuit, with the fourth circuit disabled and all of the pMOS devices of the third circuit turned on, is greater than the desired pull-up impedance.

7. The voltage mode driver of claim 5, wherein the pull-up stage further comprises A-2 additional circuits in parallel with the third and fourth circuits, each additional circuit having an additional pMOS device in series with an additional resistor,
   wherein each of the third circuit through a Bth circuit are configured to be enabled when a condition is met that the pull-up impedance of the third circuit through the (B-1) th circuits, with the Bth circuit disabled and all of the pMOS devices of the third through the (B-1) th circuits turned on, is greater than the desired pull-up impedance, and
   wherein A is an integer greater than 2, and B is an integer greater than 1.

8. The voltage mode driver of claim 1, in which each nMOS device is one of a single device or a stacked device with same or different inputs being one of data, a calibration code, or a voltage reference.

9. A voltage mode driver, comprising:
a pull-down stage including:
   a first circuit having a plurality of nMOS devices in parallel, the plurality of nMOS devices being common to a first resistor; and
   X-1 additional circuits in parallel with the first circuit, each additional circuit having an additional nMOS device in series with an additional resistor,
   wherein each of the first circuit through a Yth additional circuit are configured to be enabled when a condition is met that the pulldown impedance of the first through the (Y-1) th additional circuits, with the Yth additional circuit disabled and all of the nMOS devices of the first through the (Y-1) th circuits turned on, is greater than the desired pulldown impedance, and
   wherein X is an integer greater than 2, and Y is an integer greater than 1.

10. The voltage mode driver of claim 9, wherein the voltage mode driver is implemented in a memory device.

11. The voltage mode driver of claim 9, wherein a calibration algorithm is used to determine in ceil (log (x)) cycles when the pulldown impedance of the first through the (Y-1) th circuits, with the Yth circuit disabled and all of the nMOS devices of the first through the (Y-1) th circuits turned on, is greater than the desired pulldown impedance, and wherein a binary sequence is used to determine within log (x) cycles the value of Y.

12. The voltage mode driver of claim 9, further comprising:
a pull-up stage including:
   a third circuit having a plurality of pMOS devices in parallel, the plurality of pMOS devices being common to a third resistor; and
   a fourth circuit in parallel with the third circuit and having a pMOS device in series with a fourth resistor,
   wherein the fourth circuit is configured to be enabled when a pull-up impedance of the third circuit, with the fourth circuit disabled and all of the pMOS devices of the third circuit turned on, is greater than a desired pull-up impedance.

13. The voltage mode driver of claim 12, wherein a calibration algorithm is used to determine in one cycle when the pull-up impedance of the third circuit, with the fourth circuit disabled and all of the pMOS devices of the third circuit turned on, is greater than the desired pull-up impedance.

14. The voltage mode driver of claim 13, wherein the pull-up stage further comprises A-2 additional circuits in parallel with the third and fourth circuits, each additional circuit having an additional pMOS device in series with an additional resistor,
   wherein each of the third circuit through a Bth circuit are configured to be enabled when a condition is met that the pull-up impedance of the third circuit through the (B-1) th circuits, with the Bth circuit disabled and all of the pMOS devices of the third through the (B-1) th circuits turned on, is greater than the desired pull-up impedance, and
   wherein A is an integer greater than 2, and B is an integer greater than 1.

15. The voltage mode driver of claim 9, in which each nMOS device is one of a single device or a stacked device with same or different inputs being one of data, a calibration code, or a voltage reference.

* * * * *